(12) United States Patent
Segal et al.

(10) Patent No.: US 8,101,976 B2
(45) Date of Patent: *Jan. 24, 2012

(54) DEVICE SELECTION CIRCUITRY CONSTRUCTED WITH NANOTUBE RIBBON TECHNOLOGY

(75) Inventors: Brent M. Segal, Woburn, MA (US); Darren K. Brock, Woburn, MA (US); Thomas Rueckes, Rockport, MA (US)

(73) Assignee: Nantero Inc., Woburn, MA (US)

( * ) Notice: Subject to any disclaimer, the term of this patent is extended or adjusted under 35 U.S.C. 154(b) by 581 days.

This patent is subject to a terminal disclaimer.

(21) Appl. No.: 11/853,550

(22) Filed: Sep. 11, 2007

(65) Prior Publication Data

US 2008/0169488 A1 Jul. 17, 2008

Related U.S. Application Data

(63) Continuation of application No. 11/546,130, filed on Oct. 10, 2006, now Pat. No. 7,269,052, which is a continuation of application No. 10/693,241, filed on Oct. 24, 2003, now Pat. No. 7,120,047, which is a continuation of application No. 09/915,173, filed on Jul. 25, 2001, now Pat. No. 6,643,165.

(51) Int. Cl.
*H01L 23/52* (2006.01)
*G11C 11/00* (2006.01)
*G11C 7/00* (2006.01)
*H01L 27/10* (2006.01)

(52) U.S. Cl. ........ 257/209; 257/208; 257/331; 257/343; 257/E27.07; 438/52; 438/283; 438/668; 977/765

(58) Field of Classification Search .............. 257/209, 257/E27.07, 208, 317, 320, 331, 343; 977/708, 977/709, 721, 724, 750, 755, 933, 938, 765; 438/52, 283, 668; 365/129, 151, 153
See application file for complete search history.

(56) References Cited

U.S. PATENT DOCUMENTS

| | | |
|---|---|---|
| 3,448,302 A | 6/1969 | Shanefield |
| 3,740,494 A | 6/1973 | Dunand et al. |
| 3,892,890 A | 7/1975 | Watanabe et al. |
| 4,324,814 A | 4/1982 | Reichert |
| 4,378,629 A | 4/1983 | Bozler et al. |
| 4,495,511 A | 1/1985 | Yoder |
| 4,510,016 A | 4/1985 | Chi et al. |
| 4,524,431 A | 6/1985 | Haken et al. |

(Continued)

FOREIGN PATENT DOCUMENTS

EP 0217023 A2 4/1987
(Continued)

OTHER PUBLICATIONS

Rueckes et al.; Carbon Nanotube-Based Nonvolatile Random Access Memory for Molecular Computing; Science, Jul. 7, 2009; vol. 289, No. 5476, p. 94-97.*

(Continued)

*Primary Examiner* — N Drew Richards
*Assistant Examiner* — John P Dulka

(57) ABSTRACT

A memory system having electromechanical memory cells and decoders is disclosed. A decoder circuit selects at least one of the memory cells of an array of such cells. Each cell in the array is a crossbar junction at least one element of which is a nanotube or a nanotube ribbon. The decoder circuit is constructed of crossbar junctions at least one element of each junction being a nanotube or a nanotube ribbon.

21 Claims, 16 Drawing Sheets

U.S. PATENT DOCUMENTS

| | | |
|---|---|---|
| 4,673,474 A | 6/1987 | Ogawa et al. |
| 4,694,427 A | 9/1987 | Miyamoto et al. |
| 4,701,842 A | 10/1987 | Olnowich |
| 4,707,197 A | 11/1987 | Hensel et al. |
| 4,758,534 A | 7/1988 | Derkits, Jr. et al. |
| 4,819,212 A | 4/1989 | Nakai et al. |
| 4,845,533 A | 7/1989 | Pryor et al. |
| 4,853,893 A | 8/1989 | Eaton, Jr. et al. |
| 4,876,667 A | 10/1989 | Ross et al. |
| 4,888,630 A | 12/1989 | Paterson |
| 4,901,121 A | 2/1990 | Gibson et al. |
| 4,903,090 A | 2/1990 | Yokoyama et al. |
| 4,939,556 A | 7/1990 | Eguchi et al. |
| 4,947,226 A | 8/1990 | Huang et al. |
| 4,979,149 A | 12/1990 | Popovic et al. |
| 4,985,871 A | 1/1991 | Catlin |
| 5,010,037 A | 4/1991 | Lin et al. |
| 5,031,145 A | 7/1991 | Lever et al. |
| 5,032,538 A | 7/1991 | Bozler et al. |
| 5,051,956 A | 9/1991 | Burns et al. |
| 5,057,883 A | 10/1991 | Noda et al. |
| 5,089,545 A | 2/1992 | Pol |
| 5,155,561 A | 10/1992 | Bozler et al. |
| 5,161,218 A | 11/1992 | Catlin |
| 5,168,070 A | 12/1992 | Luth et al. |
| 5,175,597 A | 12/1992 | Cachier et al. |
| 5,184,320 A | 2/1993 | Dye |
| 5,196,396 A | 3/1993 | Lieber |
| 5,198,390 A | 3/1993 | MacDonald et al. |
| 5,198,994 A | 3/1993 | Natori et al. |
| 5,252,835 A | 10/1993 | Lieber et al. |
| 5,290,715 A | 3/1994 | Pandya |
| 5,316,979 A | 5/1994 | MacDonald et al. |
| 5,346,683 A | 9/1994 | Green et al. |
| 5,384,488 A * | 1/1995 | Golshan et al. ............. 257/786 |
| 5,412,785 A | 5/1995 | Skruhak et al. |
| 5,424,054 A | 6/1995 | Bethune et al. |
| 5,426,070 A | 6/1995 | Shaw et al. |
| 5,444,421 A | 8/1995 | Carroll et al. |
| 5,444,651 A | 8/1995 | Yamamoto et al. |
| 5,453,970 A | 9/1995 | Rust et al. |
| 5,456,986 A | 10/1995 | Majetich et al. |
| 5,475,341 A | 12/1995 | Reed |
| 5,479,172 A | 12/1995 | Smith et al. |
| 5,482,601 A | 1/1996 | Ohshima et al. |
| 5,517,194 A | 5/1996 | Carroll et al. |
| 5,521,602 A | 5/1996 | Carroll et al. |
| 5,533,061 A | 7/1996 | Smith et al. |
| 5,538,916 A | 7/1996 | Kuroi et al. |
| 5,547,748 A | 8/1996 | Ruoff et al. |
| 5,553,099 A | 9/1996 | Carroll et al. |
| 5,563,424 A | 10/1996 | Yang et al. |
| 5,586,286 A | 12/1996 | Santeler et al. |
| 5,589,692 A | 12/1996 | Reed |
| 5,590,078 A | 12/1996 | Chatter |
| 5,592,643 A | 1/1997 | Thomas |
| 5,592,644 A | 1/1997 | Thomas |
| 5,608,246 A | 3/1997 | Yeager et al. |
| 5,608,888 A | 3/1997 | Purcell et al. |
| 5,623,638 A | 4/1997 | Andrade |
| 5,626,670 A | 5/1997 | Varshney et al. |
| 5,626,812 A | 5/1997 | Ebbesen et al. |
| 5,640,133 A | 6/1997 | MacDonald et al. |
| 5,640,343 A | 6/1997 | Gallagher et al. |
| 5,650,958 A | 7/1997 | Gallagher et al. |
| 5,651,126 A | 7/1997 | Bailey et al. |
| 5,652,856 A * | 7/1997 | Santeler et al. ............. 711/105 |
| 5,699,317 A | 12/1997 | Sartore et al. |
| 5,716,708 A | 2/1998 | Lagow |
| 5,719,073 A | 2/1998 | Shaw et al. |
| 5,721,862 A | 2/1998 | Sartore et al. |
| 5,739,057 A | 4/1998 | Tiwari et al. |
| 5,747,180 A | 5/1998 | Miller et al. |
| 5,751,156 A | 5/1998 | Muller et al. |
| 5,753,088 A | 5/1998 | Olk |
| 5,780,101 A | 7/1998 | Nolan et al. |
| 5,781,717 A | 7/1998 | Wu et al. |
| 5,793,697 A | 8/1998 | Scheuerlein |
| 5,799,209 A | 8/1998 | Chatter |
| 5,802,583 A | 9/1998 | Yeager et al. |
| 5,838,165 A | 11/1998 | Chatter |
| 5,840,435 A | 11/1998 | Lieber et al. |
| 5,841,692 A | 11/1998 | Gallagher et al. |
| 5,846,849 A | 12/1998 | Shaw et al. |
| 5,847,454 A | 12/1998 | Shaw et al. |
| 5,847,565 A | 12/1998 | Narayanan et al. |
| 5,850,089 A | 12/1998 | Varshney et al. |
| 5,850,231 A | 12/1998 | Orimoto et al. |
| 5,858,862 A | 1/1999 | Westwater et al. |
| 5,875,451 A | 2/1999 | Joseph |
| 5,878,840 A | 3/1999 | Tessum et al. |
| 5,887,272 A | 3/1999 | Sartore et al. |
| 5,897,945 A | 4/1999 | Lieber et al. |
| 5,903,010 A | 5/1999 | Flory et al. |
| 5,909,624 A | 6/1999 | Yeager et al. |
| 5,914,553 A | 6/1999 | Adams et al. |
| 5,925,465 A | 7/1999 | Ebbesen et al. |
| 5,928,450 A | 7/1999 | Russell |
| 5,930,164 A | 7/1999 | Zhu |
| 5,939,785 A | 8/1999 | Klonis et al. |
| 5,946,228 A | 8/1999 | Abraham et al. |
| 5,946,930 A | 9/1999 | Anthony |
| 5,973,444 A | 10/1999 | Xu et al. |
| 5,985,446 A | 11/1999 | Lagow |
| 5,993,697 A | 11/1999 | Cohen et al. |
| 5,994,733 A | 11/1999 | Nishioka et al. |
| 5,997,832 A | 12/1999 | Lieber et al. |
| 6,025,618 A | 2/2000 | Chen |
| 6,031,711 A | 2/2000 | Tennent et al. |
| 6,031,756 A | 2/2000 | Gimzewski et al. |
| 6,036,774 A | 3/2000 | Lieber et al. |
| 6,038,060 A | 3/2000 | Crowley |
| 6,038,637 A | 3/2000 | Berube et al. |
| 6,044,008 A | 3/2000 | Choi et al. |
| 6,048,740 A | 4/2000 | Hsu et al. |
| 6,049,856 A | 4/2000 | Bolyn |
| 6,051,866 A | 4/2000 | Shaw et al. |
| 6,052,263 A | 4/2000 | Gill |
| 6,052,313 A | 4/2000 | Atsumi et al. |
| 6,060,724 A | 5/2000 | Flory et al. |
| 6,062,931 A | 5/2000 | Chuang et al. |
| 6,063,243 A | 5/2000 | Zettl et al. |
| 6,064,107 A | 5/2000 | Yeh et al. |
| 6,069,380 A | 5/2000 | Chou et al. |
| 6,072,718 A | 6/2000 | Abraham et al. |
| 6,083,624 A | 7/2000 | Hiura et al. |
| 6,087,293 A | 7/2000 | Carnahan et al. |
| 6,088,760 A | 7/2000 | Walker et al. |
| 6,100,109 A | 8/2000 | Melzner et al. |
| 6,104,633 A | 8/2000 | Abraham et al. |
| 6,105,381 A | 8/2000 | Ghoshal |
| 6,108,725 A | 8/2000 | Chatter |
| 6,128,214 A | 10/2000 | Kuekes et al. |
| 6,136,160 A | 10/2000 | Hrkut et al. |
| 6,138,219 A | 10/2000 | Soman et al. |
| 6,146,227 A | 11/2000 | Mancevski |
| 6,156,256 A | 12/2000 | Kennel |
| 6,159,620 A | 12/2000 | Heath et al. |
| 6,159,742 A | 12/2000 | Lieber et al. |
| 6,165,890 A | 12/2000 | Kohl et al. |
| 6,166,948 A | 12/2000 | Parkin et al. |
| 6,177,703 B1 | 1/2001 | Cunningham |
| 6,183,714 B1 | 2/2001 | Smalley et al. |
| 6,187,823 B1 | 2/2001 | Haddon et al. |
| 6,190,634 B1 | 2/2001 | Lieber et al. |
| 6,198,655 B1 | 3/2001 | Heath et al. |
| 6,203,814 B1 | 3/2001 | Fisher et al. |
| 6,203,864 B1 | 3/2001 | Zhang et al. |
| 6,212,597 B1 | 4/2001 | Conlin et al. |
| 6,219,212 B1 | 4/2001 | Gill et al. |
| 6,221,330 B1 | 4/2001 | Moy et al. |
| 6,226,722 B1 | 5/2001 | Shippy et al. |
| 6,231,744 B1 | 5/2001 | Ying et al. |
| 6,231,980 B1 | 5/2001 | Cohen et al. |
| 6,232,706 B1 | 5/2001 | Dai et al. |
| 6,233,665 B1 | 5/2001 | Bolyn |
| 6,237,130 B1 | 5/2001 | Soman et al. |

| | | |
|---|---|---|
| 6,239,547 B1 | 5/2001 | Uemura et al. |
| 6,250,984 B1 | 6/2001 | Jin et al. |
| 6,256,767 B1 | 7/2001 | Kuekes et al. |
| 6,259,277 B1 | 7/2001 | Tour et al. |
| 6,262,469 B1 | 7/2001 | Le et al. |
| 6,277,318 B1 | 8/2001 | Bower et al. |
| 6,300,205 B1 | 10/2001 | Fulford et al. |
| 6,314,019 B1 | 11/2001 | Kuekes et al. |
| 6,320,428 B1 | 11/2001 | Atsumi et al. |
| 6,322,713 B1 | 11/2001 | Choi et al. |
| 6,325,909 B1 | 12/2001 | Li et al. |
| 6,331,209 B1 | 12/2001 | Jang et al. |
| 6,346,413 B1 | 2/2002 | Fodor et al. |
| 6,348,295 B1 | 2/2002 | Griffith et al. |
| 6,348,700 B1 | 2/2002 | Ellenbogen et al. |
| 6,350,488 B1 | 2/2002 | Lee et al. |
| 6,358,756 B1 | 3/2002 | Sandhu et al. |
| 6,361,861 B2 | 3/2002 | Gao et al. |
| 6,362,073 B2 | 3/2002 | Kim et al. |
| 6,380,434 B1 | 4/2002 | Chiang et al. |
| 6,400,088 B1 | 6/2002 | Livingston et al. |
| 6,400,091 B1 | 6/2002 | Deguchi et al. |
| 6,406,776 B1 | 6/2002 | D'Evelyn |
| 6,407,443 B2 | 6/2002 | Chen et al. |
| 6,413,487 B1 | 7/2002 | Resasco et al. |
| 6,417,606 B1 | 7/2002 | Nakamoto et al. |
| 6,420,726 B2 | 7/2002 | Choi et al. |
| 6,421,271 B1 | 7/2002 | Gogl et al. |
| 6,422,450 B1 | 7/2002 | Zhou et al. |
| 6,423,583 B1 | 7/2002 | Avouris et al. |
| 6,426,134 B1 | 7/2002 | Lavin et al. |
| 6,426,687 B1 | 7/2002 | Osborn |
| 6,432,740 B1 | 8/2002 | Chen |
| 6,443,901 B1 | 9/2002 | Fraser |
| 6,445,006 B1 | 9/2002 | Brandes et al. |
| 6,495,116 B1 | 12/2002 | Herman |
| 6,515,339 B2 | 2/2003 | Shin et al. |
| 6,518,156 B1 | 2/2003 | Chen et al. |
| 6,548,841 B2 | 4/2003 | Frazier et al. |
| 6,566,983 B2 | 5/2003 | Shin et al. |
| 6,574,130 B2 | 6/2003 | Segal et al. |
| 6,635,506 B2 * | 10/2003 | Volant et al. .............. 438/52 |
| 6,643,165 B2 * | 11/2003 | Segal et al. ............. 365/151 |
| 6,706,402 B2 | 3/2004 | Rueckes et al. |
| 6,707,098 B2 | 3/2004 | Hofmann et al. |
| 6,759,693 B2 | 7/2004 | Vogeli et al. |
| 6,803,840 B2 | 10/2004 | Hunt et al. |
| 6,809,462 B2 | 10/2004 | Pelrine et al. |
| 6,809,465 B2 | 10/2004 | Jin |
| 6,836,424 B2 * | 12/2004 | Brock et al. .............. 365/129 |
| 6,911,682 B2 * | 6/2005 | Rueckes et al. .......... 257/202 |
| 6,918,284 B2 | 7/2005 | Snow et al. |
| 6,919,592 B2 * | 7/2005 | Brock et al. .............. 257/209 |
| 6,919,740 B2 | 7/2005 | Snider |
| 6,924,538 B2 | 8/2005 | Jaiprakash et al. |
| 6,955,937 B1 | 10/2005 | Burke et al. |
| 6,969,651 B1 | 11/2005 | Lu et al. |
| 6,990,009 B2 | 1/2006 | Bertin et al. |
| 7,015,500 B2 | 3/2006 | Choi et al. |
| 7,115,901 B2 | 10/2006 | Bertin et al. |
| 7,115,960 B2 | 10/2006 | Bertin et al. |
| 7,161,403 B2 | 1/2007 | Bertin |
| 2001/0004979 A1 | 6/2001 | Han et al. |
| 2001/0023123 A1 | 9/2001 | Kim |
| 2001/0023986 A1 | 9/2001 | Mancevski |
| 2002/0055010 A1 | 5/2002 | Gao et al. |
| 2002/0061441 A1 | 5/2002 | Ogura et al. |
| 2002/0068170 A1 | 6/2002 | Smalley et al. |
| 2002/0081380 A1 | 6/2002 | Dillon et al. |
| 2002/0081787 A1 | 6/2002 | Kohl et al. |
| 2002/0088938 A1 | 7/2002 | Colbert et al. |
| 2002/0090331 A1 | 7/2002 | Smalley et al. |
| 2002/0092983 A1 | 7/2002 | Colbert et al. |
| 2002/0092984 A1 | 7/2002 | Colbert et al. |
| 2002/0096634 A1 | 7/2002 | Colbert et al. |
| 2002/0098135 A1 | 7/2002 | Smalley et al. |
| 2002/0102193 A1 | 8/2002 | Smalley et al. |
| 2002/0102194 A1 | 8/2002 | Smalley et al. |
| 2002/0102196 A1 | 8/2002 | Smalley et al. |
| 2002/0102353 A1 | 8/2002 | Mauthner et al. |
| 2002/0112814 A1 | 8/2002 | Hafner et al. |
| 2002/0125805 A1 | 9/2002 | Hsu |
| 2002/0130353 A1 | 9/2002 | Lieber et al. |
| 2002/0160111 A1 | 10/2002 | Sun et al. |
| 2002/0172639 A1 | 11/2002 | Horiuchi et al. |
| 2002/0173083 A1 | 11/2002 | Avouris et al. |
| 2002/0175323 A1 | 11/2002 | Guillom et al. |
| 2002/0175390 A1 | 11/2002 | Goldstein et al. |
| 2002/0179434 A1 | 12/2002 | Dai et al. |
| 2003/0004058 A1 | 1/2003 | Li et al. |
| 2003/0021966 A1 | 1/2003 | Segal et al. |
| 2003/0200521 A1 | 10/2003 | DeHon et al. |
| 2004/0181630 A1 | 9/2004 | Jaiprakash et al. |
| 2004/0238907 A1 | 12/2004 | Pinkerton et al. |
| 2005/0056877 A1 | 3/2005 | Rueckes et al. |
| 2005/0065741 A1 | 3/2005 | Segal et al. |
| 2005/0068128 A1 | 3/2005 | Yip |
| 2006/0237537 A1 | 10/2006 | Empedocles et al. |
| 2006/0237799 A1 | 10/2006 | Lu et al. |
| 2006/0278902 A1 | 12/2006 | Sun et al. |

FOREIGN PATENT DOCUMENTS

| | | |
|---|---|---|
| EP | 0269225 A2 | 6/1988 |
| EP | 0269716 A1 | 6/1988 |
| EP | 0296716 A2 | 12/1988 |
| EP | 0315392 A2 | 5/1989 |
| EP | 426282 A2 | 5/1991 |
| EP | 441409 A2 | 8/1991 |
| EP | 0613130 A1 | 8/1994 |
| EP | 0665187 A1 | 8/1995 |
| EP | 0688618 A1 | 12/1995 |
| EP | 758028 A2 | 2/1997 |
| EP | 0947466 A1 | 3/1998 |
| EP | 0945402 A1 | 9/1999 |
| EP | 0989579 A2 | 3/2000 |
| EP | 1046613 A2 | 10/2000 |
| EP | 1052520 A1 | 11/2000 |
| EP | 1054249 A1 | 11/2000 |
| EP | 1059266 A2 | 12/2000 |
| EP | 1061040 A1 | 12/2000 |
| EP | 1061043 A1 | 12/2000 |
| EP | 1061044 A1 | 12/2000 |
| EP | 1061544 A1 | 12/2000 |
| EP | 1061555 A1 | 12/2000 |
| EP | 1069206 A2 | 1/2001 |
| EP | 1072693 A1 | 1/2001 |
| EP | 1096533 A1 | 5/2001 |
| EP | 1100106 A2 | 5/2001 |
| EP | 1100297 A1 | 5/2001 |
| EP | 1132920 A2 | 9/2001 |
| EP | 1205436 A1 | 5/2002 |
| EP | 1209123 A2 | 5/2002 |
| EP | 1225613 A1 | 7/2002 |
| GB | 2364933 A | 2/2002 |
| JP | 11011917 A | 1/1999 |
| WO | WO-9502709 A2 | 1/1995 |
| WO | WO-9638410 A1 | 12/1996 |
| WO | WO-9641043 A1 | 12/1996 |
| WO | WO-9709272 A1 | 3/1997 |
| WO | WO-9722971 A1 | 6/1997 |
| WO | WO-9731139 A1 | 8/1997 |
| WO | WO-9743473 A1 | 11/1997 |
| WO | WO-9826871 A1 | 6/1998 |
| WO | WO-9839250 A1 | 9/1998 |
| WO | WO-9839251 A1 | 9/1998 |
| WO | WO-9842620 A1 | 10/1998 |
| WO | WO-9848456 A1 | 10/1998 |
| WO | WO-9906618 A1 | 2/1999 |
| WO | WO-9947570 A1 | 9/1999 |
| WO | WO-9948810 A1 | 9/1999 |
| WO | WO-9958748 A1 | 11/1999 |
| WO | WO-9965821 A1 | 12/1999 |
| WO | WO-0008650 A1 | 2/2000 |
| WO | WO-0009443 A1 | 2/2000 |
| WO | WO-0017101 A1 | 3/2000 |
| WO | WO-0019494 A1 | 4/2000 |
| WO | WO-0044094 A1 | 7/2000 |
| WO | WO-0048195 A1 | 8/2000 |

| | | | |
|---|---|---|---|
| WO | WO-0063115 A1 | 10/2000 |
| WO | WO-0073204 A1 | 12/2000 |
| WO | WO-0103208 | 1/2001 |
| WO | WO-0118246 A1 | 3/2001 |
| WO | WO-0123303 A1 | 4/2001 |
| WO | WO-0144796 A1 | 6/2001 |
| WO | WO-0219420 A2 | 3/2002 |
| WO | WO-0237500 A1 | 5/2002 |
| WO | WO-0238496 A1 | 5/2002 |
| WO | WO-0242204 A2 | 5/2002 |
| WO | WO-0248701 | 6/2002 |
| WO | WO-0248822 A2 | 6/2002 |
| WO | WO-02054505 A2 | 7/2002 |
| WO | WO-02059898 A2 | 8/2002 |
| WO | WO-02060812 A2 | 8/2002 |
| WO | WO-02060813 A2 | 8/2002 |
| WO | WO-03091486 A1 | 11/2003 |
| WO | WO-2004065655 A1 | 8/2004 |
| WO | WO-2004065657 A1 | 8/2004 |
| WO | WO-2004065671 A1 | 8/2004 |

OTHER PUBLICATIONS

Thess et al.; Crystalline Ropes of Metallic Carbon Nanotubes; Science, Jul. 26, 1996; vol. 273, No. 5274, p. 483-487.*

Cui et al.; Doping and Electrical Transport in Silicon Nanowires; American Chemical Society; Jun. 8, 2000; vol. 104, No. 22, p. 5213-5216.*

"8 Mb Synchronous Communication SRAM (IBM0418A86LQKA, IBM0418A86SQKA, IBM0436A861QKA, IBM436A86SQKA)." International Business Machines Corp. (IBM), 1999.

"Double Sided 4Mb SRAM Coupled Cap PBGA Card Assembly Guide." International Business Machines Corp. (IBM), 1998.

"IBM Builds Tiny Transistor that Beats Silicon", Technology—Reuters, Yahoo, May 16, 2002.

"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/AInterface, Preliminary Specifications, Advance Information, (C) 1996-2000 Nanochip Document NCM2230500."

"Package Mechanicals for USAR ICs." USAR Systems, Inc., 1998.

"Preliminary: 8Mb (256K.times.36 & 512K.times.18) and 4Mb (128K.times.36 & 256K.times.18) [IBM0418A8CBLBB, IBM0418A4CBLBB, IBM0436A8CBLBB, IBM0436A4CBLBB]." International Business Machines Corp. (IBM), 1998.

"The Ultimate Memory Guide." Kingston Technology (1998).

Advanced Semiconductor Engineering, Inc., Substrate Design 420L BGA 35*35, Dwg. No. K-I-0420, 2 pages.

Ago, Hiroki et al. "Gas-Phase Synthesis of Single-wall Carbon Nanotubes from Colloidal Solution of Metal Nanoparticles." Journal of Physical Chemistry B (Nov. 1, 2001); 105, 10453-10456.

Ajayan, P. M. et al. "Nanotubes in a Flash—Ignition and Reconstruction." Science (Apr. 26, 2002); 296, 705.

Ajayan, Pulickel M. and Otto Z. Zhou. "Applications of Carbon Nanotubes." Topics in Applied Physics (2001); 80, 391-425.

An, Lei, "Synthesis of Nearly Uniform Single-Walled Carbon Nanotubes Using Identical Metal-Containing Molecular Nanoclusters as Catalysts," j. Amer. Chem. Soc., 2002, vol. (?), total of 4 pgs.

Avouris, P., "Carbon nanotube electronics," Carbon, 2002, vol. 40, pp. 429-445.

Bachtold, A. et al., "Logic circuits based on carbon nanotubes," Physica E, 16 (2003) 42-46.

Bahr, Jeffrey L. and James. M. Tour. "Highly Functionalized Carbon Nanotubes Using in Situ Generated Diazonium Compounds." Chemical Materials (2001); 13, 3823-3824.

Bahr, Jeffrey L., "Functionalization of Carbon Nanotubes by Electrochemical Reduction of Aryl Diazonium Salts: A Bucky Paper Electrode," American Chemical Society, 2001, vol. 123, pp. 6536-6542.

Batra, Inder P., "Quantum transport through one-dimensional aluminum wires," J. Vac. Sci Technol., May/Jun. 2002, B 20(3), pp. 812.sub.—817.

Bekyarova, E. et al. "Oxidation and Porosity Evaluation of Budlike Single-Wall Carbon Nanohorn Aggregates." American Chemical Society (2002).

Benerjee, Sarbajit and Stanislaus S. Wong. "Functionalization of Carbon Nanotubes with a Metal-Containing Molecular Complex." Nano Letters (2001); 0, A-E.

Berber, S., Phys. Rev. Lett, 84, 4613 (2000).

Berber, Savas, "Unusually High Thermal Conductivity of Carbon Nanotubes," Physical Review Letters, May 15, 2000, vol. 84, No. 20, pp. 4613-4616.

Bergbreiter, David E., "Using Soluble Polymers to Recover Catalysts and Ligands," Chemical Reviews, Mar. 5, 2002, pp. A-AM.

Berry, A.D., "Fabrication of GaAs and InAs wires in nanochannel gas," Applied Physics Letters, Nov. 4, 1996, vol. 69, pp. 2846-2848.

Blick, R.H., "Nanostructural silicon for studying fundamental aspects of nanomechanics," J. of Physics: Condensed Matter, (2002), pp. R905-R945.

Bonard, J., et al., "Monodisperse Multiwall Carbon Nanotubes Obtained with Ferritin as Catalyst," Nano Leters, (2002), vol. 2, No. 6, pp. 665-667.

Bozler, C.O., et al., "Fabrication and Microwave Performance of the Permeable Base Transistor," IEEE Tech. Dig. Int. Electron Devices Meeting (1979) 384.

Bozovic, Dolores et al. "Electronic properties of mechanically induced kinds on single-walled carbon nanotubes." Applied Physics Letters (Jun. 4, 2001);78, 3693-3695.

Bradley, K. et al., "Flexible Nanotube Electronics," Nano Letters 2003, vol. 3, No. 10, 1353-1355.

Brown, David A. et al. "Kinetics of Inron(III) Chelation from Polynuclear Oxo-Hydroxy Aggregates by Hydroxamic Acids." Inorganic Chemistry (1999); 38, 5198-5202.

Callaby, D. Roy et al. "Solid State Memory Study Final Report." National Media Lab, Feb. 1994.

Calleja, M., "Fabrication of gold nanowires on insulating substrates by field-induced mass transport," Applied Physics Letters, Oct. 8, 2001, vol. 79, pp. 2471-2473.

Cao, Anyuan et al. "Macroscopic Three-Dimensional Arrays of Fe Nanoparticles Supported in Aligned Carbon Nanotubes." The Journal of Physical Chemistry B (2001); 105, 11937-11940.

Cassell, Alan M. et al. "Large Scale CVD Synthesis of Single-Walled Carbon Nanotubes." American Chemical Society (1999): 6484-6492.

Cassell, Alan M., "Combinatorial Optimization of Heterogeneous Catalysts Used in the Growth of Carbon Nanotubes," Langmuir 2001, vol. 17, pp. 260-264.

Cassell, Alan M., "Directed Growth of Free-Standing Single-Walled Carbon Nanotubes," American Chemical Society, Jun. 21, 1999, vol. 121, pp. 7975-7976.

Cassell, Alan M., "Large Scale CVD Synthesis of Single-Walled Carbon Nanotubes," J. Phys. Chem. B 1999, vol. 103, pp. 6484-6492.

Charlier, Jean-Chrisophe and Sumio Iijima. "Growth Mechanisms of Carbon Nanotubes." Topics in Applied Physics (2001); 80, 55-81.

Chattopadhyay, et al., "Metal-Assisted Organization of Shortened Carbon Nanotubes in Monolayer and Mulilayer Forest Assemblies," Journal of the American Chemical Society, Aug. 28, 2001, vol. 123, 9451-9452.

Chen, Bin, "Heterogeneous Single-Walled Carbon Nanotube Catalyst Discovery and Optimization," Chemical Materials, Dec. 7, 2001, vol. 14, pp. 1891-1896.

Chen, J. et al., "Large On-Off Ratios and Negative Differential Resistance in a Molecular Electronic Device," Science, vol. 286, Nov. 19, 1999, pp. 1550-151.

Chen, J. et al., "Self-aligned carbon nanotube transistors with charge transfer doping," Applied Physics Letters 86, 123108 (2005).

Chen, J. et al., "Self-aligned Carbon Nanotube Transistors with Novel Chemical Doping," IEDM 04-695, 2004, pp. 1-4.

Chen, Robert J. et al. "Molecular photodesorption from single-walled carbon nanotubes." Applied Physics Letters (Oct. 1, 2001): 2258-2260.

Chen, Robert J. et al. "Noncovalent Sidewall Functionalization of Single-Walled Carbon Nanotubes for Protein Immobilization." American Chemical Society (2001): 3838-3839.

Chen, Robert J., "Noncovalent Sidewall Functionalization of Single-Walled Carbon Nanotubes for Protein Immobilization," J. Amer. Chem. Soc., 2001, vol. 123, pp. 3838-3839.

Cheng, H. M. et al. "Large-scale and low-cost synthesis of single-walled carbon nanotubes by the catalytic pyrolysis of hydrocarbons." Applied Physics Letters (Jun. 22, 1998); 72, 3282-3284.

Cheung. Chin Li et al. "Growth and fabrication with single-walled carbon nanotube probe microscopy tips." Applied Physics Letters (2000); 76, 3136-3138.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Choi, Hee Cheul, "Spontaneous Reduction of Metal Ions on the Sidewalls of Carbon Nanotubes," J. Amer. Chem. Soc., May 7, 2002, pp. A-B.

Ci, Lijie, "Double Wall Carbon Nanotubes Promoted by Sulfur in a Floating Iron Catalyst CVD System," Chemical Physics Letters 359, Jun. 13, 2002, pp. 63-67.

Ciraci, S., "Quantum effects in electrical and thermal transport through nanowires," J. of Physics: Condensed Matter, (2001), pp. R537-R568.

Cleland, A.N., "Single-crystal aluminum nitride nanomechanical resonators," Applied Physics Letters, Sep. 24, 2001, vol. 79, pp. 2070-2072.

Collier, C.P., et al., "Electronically Configurable Molecular-Based Logic Gates," Science, vol. 285. Jul. 16, 1999, pp. 391-394.

Collins, P., et al., "Engineering Carbon Nanotubes and Nanotube Circuits Using Electrical Breakdown," Science (2001); 292: 706-709.

Colomer, J. F., "Different Purification Methods of Carbon Nanotubes Produced by Catalytic Synthesis," Synthetic Metals 103, 1999, pp. 2482-2483.

Colomer, J. F., et al., "Characterization of Single-Walled Carbon Nanotubes Produced by CCVD Method," Chemical Physics Letters (2001); 345, 11-17.

Connelly, Neil G., "Chemical Redox Agents for Organometallic Chemistry," Chemical Reviews, Jan. 9, 1996, vol. 96, pp. 877-910.

Crystal Growth, Wafer Fabrication and Basic Properties of Silicon Wafers, Chapter 3, pp. 93-149.

Cui, Yi et al. "Functional Nanoscale Electronic Devices Assembled Using Silicon Nanowire Building Blocks." Science (2001); 291: 851-53.

Cui, Yi, "Functional Nanoscale Electronic Devices Assembled Using Silicon Nanowire Building Blocks," Science, Feb. 2, 2001, vol. 291, pp. 851-853.

Cui, Yi. "Doping and Electrical Transport in Silicon Nanowires." The Journal of Physical Chemistry B (2000); vol. 104, No. 22: 5213-5216.

Dai, Hongjie et al. "Exploiting the properties of carbon nanotubes for nanolithography." Applied Physics Letters (Sep. 14, 1998); 73, 1508-1510.

Dai, Hongjie. "Controlled Chemical Routes to Nanotube Architectures, Physics, and Devices." The Journal of Physical Chemistry B (1999); 103: 11246-11255.

Dai, Hongjie. "Nanotube Growth and Characterization." Topics in Applied Physics (2001); 80, 29-53.

Dai, Hongju, "Controlled Chemical Routes to Nanotube Architectures, Physics, and Devices," J. Phys. Chem. B 1999, vol. 103, pp. 11246-11255.

Dalton, a.B., "A Functional Conjugated Polymer to Process, Purify and Selectively Interact with Single Wall Carbon Nanotubes," Synthetic Metals 121, 2001, pp. 1217-1218.

De Vos, Dirk E., "Ordered Mesoporous and Microporous Molecular Sieves Functionalized with Transition Metal Complexes as Catalysts for Selective Organic Transformations," Chemical Reviews, Jan. 31, 2002, pp. A-Z.

Delzeit, L., et al., "Multilayered Metal Catalysts for Controlling the Density of Single-walled Carbon Nanotube Growth," Chemical Physics Letters, 348, 368, 2001.

Deng, S. Z., "Synthesis of silicon carbide nanowires in a catalyst-assisted process," Chemical Physics Letters, Apr. 26, 2002, vol. 356, pp. 511-514.

Dequesnes, Marc, "Calculation of pull-in voltages for carbon-nanotube-based nanoelectromechanical switches," Nanotechnology, Jan. 22, 2002, vol. 13, pp. 120-131.

Derycke, V. et al. "Carbon Nanotube Inter-and Intramolecular Logic Gates." Nano Letters (Sep. 2001); 1, 453-456.

Derycke, V., "Catalyst-Free Growth of Ordered Single-Walled Carbon Nanotube Networks," Nano Letters, 2002, pp. A-D.

Derycke. V. et al., "Controlling doping and carrier injection in carbon nanotube transistors," Applied Physics Letters, vol. 80, No. 15, Apr. 15, 2002, pp. 2773-2775.

Diehl, Michael R. et al. "Self-Assembled, Deterministic Carbon Nanotube Wiring Networks." Angew. Chemical International Edition (2002): 41, 353-356.

Diehl, Michael R., "Self-Assembled, Deterministic Carbon Nanotube Wiring Networks," Angew. Chem. Int. Ed. , 200, vol. 41, pp. 353-356.

Dillon, Anne C., "A Simple and Complete Purification of Single-Walled Carbon Nanotube Materials," Advanced Materials, 1999, vol. 11, pp. 1354-1358.

Dinaro, Joanna, "Analysis of an Elementary Reaction Mechanism for Benzene Oxidation in Supercritical Water, Combustion Institute," 2000, vol. 28, pp. 1529-1536.

Dipert, Brian. "Exotic Memories, Diverse Approaches." EDN Magazine. Apr. 26, 2001, 56-70.

Dipert, Brian. "Memory Cards: Designing with a Full Deck." EDN Magazine. May 25, 2000.

Douglas, Trevor and Vistoria T. Stark. "Nanophase Cobalt Oxyhydroxide Mineral Synthesized within the Protein Cage of Ferritin," Inorganic Chemistry (2000); 39, 1828-1830.

Dresselhaus, M.S., "Raman Spectroscopy on One Isolated Carbon Nanotube," Physica B 323, 2002, pp. 15-20.

Dresselhaus, Mildred S. and Morinobu Endo. "Relation of Carbon Nanotubes to Other Carbon Materials." Topics in Applied Physics (2001); 80, 11-28.

Dresselhaus, Mildred S. and Phaedon Avouris. "Introduction to Carbon Materials Research." Topics Applied Physics (2001); 80, 1-9.

Dresselhaus, Mildred S., Preface (Publication unknown) Jan. 2001.

Duan, Xiangfeng, "Indium phosphide nanowires as building blocks for nanoscale electronic and optoelectronic devices," Nature, Jan. 4, 2001, vol. 409, pp. 66-69.

Duan, Xiangfeng, "Nonvolatile Memory and Programmable Logic from Molecule-Gated Nanowires," Nano Letters, 2002, pp. A-D.

Duan, Xiangfeng, Nonvolatile Memory and Programmable Logic from Molecule-Gated Nanowires, Nano Letters, Mar. 2002, pp. 1-4.

Duan, Xiangfeng. "Indium Phosphide Nanowires as Building Blocks for Nanoscale Electronic and Optoelectronic Devices." Nature (2001); 409: 66-69.

Dubois, S., "Fabrication and properties of arrays of superconducting nanowires," Journal of Materials Research Mar. 1999, vol. 14, pp. 665-671.

Durkop, T., "Nanotubes are High Mobility Semiconductors," Department of Physics, University of Maryland, 4 pgs.

Erkoc et al., Int. J. Modern Phys. C, 12:865-870 (2001).

Fan, Hongyou, "Multiphased assembly of nanoporous silica particles," Journal of Non-Crystalline Solids (2001) vol. 285, pp. 71-78.

Fan, Shoushan et al. "Carbon nanotube arrays on silicon substrates and their possible application." Physica E (2000): 179-183.

Fan, Shoushan et al. "Self-Oriented Regular Arrays of Carbon Nanotubes and Their Field Emission Properties." Science (Jan. 22, 1999); 283, 512-514.

Filho, A. G. Souza et al. "Electronic transition energy Eli for an isolated (n, m) single-wall carbon nanotube obtained by anti-Stokes/ Stokes resonant Raman intensity ratio." Physical Review (2002); 63, 241404(4).

Fink, Joerg H. and Philippe Lambin. "Electron Spectroscopy Studies of Carbon Nanotubes." Topics in Applied Physics (2001); 80, 247-272.

Flahaut, E. et al. "Synthesis of single-walled carbon nanotube-Co-MgO composite powders and extraction of the nanotubes." Journal of Chemical Materials (2000); 10, 249-252.

Forro, Laszlo and Christian Schoenenberger. "Physical Properties of Multi-wall Nanotubes." Topics in Applied Physics (2001);80, 329-391.

Franklin, Nathan R. and Hongjie Dai, "An Enhanced CVD Approach to Extensive Nanotube Networks with Directionality." Advanced Materials (2000): 890-894.

Franklin, Nathan R. et al. "Patterned growth of single-walled carbon nanotubes on full 4-inch wafers." Applied Physics Letters (Dec. 31, 2001); 79, 4571-4573.

Franklin, Nathan R., "Integration of suspended carbon nanotube arrays into electronic devices and electromechanical systems," Applied Physics Letters, Jul. 29, 2002, vol. 81, No. 5, 913-915.

Franklin, Nathan R., "Integration of suspended carbon nanotube arrays into electronic devices and electromechanical systems," Applied Physics Letters, Jul. 29, 2002, vol. 81, pp. 913-915.

Fruchart, O., "Vertical self-organization of epitaxial magnetic nanostructures," Journal of Magnetism and Magnetic Materials, 2002, vol. 239, pp. 224-227.

Fu, Qiang, "Electrodeposition of Carbon Films from Various Organic Liquids," Surface & Coatings Technology 124, 2000, pp. 196-200.

Fuhrer, M.S., "High-Mobility Nanotube Transistor Memory," Nano Letters, 2002, vol. 2, No. 7, pp. 755-759.

Gromov, A., "Purification of Carbon Nanotubes," Caramel Workshop, Jan. 23, 2002, pp. 1-13.

Haddon, R. C. "C70 Thin Film Transistors." Journal of the American Chemical Society (1996); 118, 3041-3042.

Hafner, J.H. et al. "Structural and functional imaging with carbon nanotube AFM probes." Progress in Biophysics & Molecular Biology (2001); 77, 73-110.

Hafner, Jason H. et al. "Catalytic growth of single-wall carbon nanotubes from metal particles." Chemical Physics Letters (Oct. 30, 1998); 296, 195-202.

Hafner, Jason H. et al. "Direct Growth of Single-Walled Carbon Nanotube Scanning Probe Microscopy Tips." Journal of the American Chemical Society (1999); 121, 9750-9751.

Hafner, Jason H. et al. "Growth of nanotubes for probe microscopy tips." Scientific Correspondence (Apr. 29, 1999); 398, 761, 762.

Hafner, Jason H. et al. "High-Yield Assembly of Individual Single-Walled Carbon Nanotube Tips for Scanning Prone Microscopies." The Journal of Physical Chemistry (Feb. 1, 2001); 105, 743-746.

Harutyunyan, A., et al., "CVD Synthesis of Single Wall Carbon Nanotubes under 'Soft' Conditions," Nano Letters vol. 2c No. 5 525 (2002); Published on web Mar. 27, 2002.

Harutyunyan, Avetik R., "CVD Synthesis of Single Wall Carbon Nanotubes under "Soft" Conditions," Nano Letters, Feb. 25, 2002, pp. A-F.

Hatzikontsantinidou et al., Phys. Scripta 54: 226-229 (1994).

He, J. Z., "Dispersion, refinement, and manipulation of single silicon nanowires," Applied Physics Letters, Mar. 11, 2002, vol. 80, pp. 1812-1814.

Heinze, S., "Carbon Nanotubes as Schottky Barrier Transistors," Physical Review Letters, Sep. 2, 2002, vol. 89, No. 10, 106801-1-106801-4.

Heinze, S., "Carbon Nanotubes as Schottky Barrier Transistors," Physical Review Letters, Sep. 2, 2002, vol. 89, pp. 106801-1 through 106801-4.

Hernadi, K., "Reactivity of Different Kinds of Carbon During Oxidative Purification of Catalytically Prepared Carbon Nanotubes,", Solid State Ionics 141-142, 2001, pp. 203-209.

Homma, Y., "Single-Walled Carbon Nanotube Growth on Silicon Substrates Using Nanoparticle Catalysts," Jpn. J. Appl. Phys., (220) vol. 41, pp. L89-L91.

Homma, Yoshikazu, "Growth of suspended carbon nanotube networks on 100-nm-scale silicon pillars," Applied Physics Letters, Sep. 16, 2002, vol. 81, pp. 2261-2263.

Hone, James. "Phonons and Thermal Properties of Carbon Nanotubes." Topics of Applied Physics (2001); 80, 273-286.

Hou, P. X., "Multi-step purification of carbon nanotubes," 2002 Elsevier Science Ltd., Mar. 8, 2001, vol. 40, pp. 81-85.

Hu, Jiangtao et al. "Controlled Growth and Electrical Properties of Heterojunctions of Carbon Nanotubes and Silicon Nanowires." Nature (1999); 399: 48-51.

Huang, et al., "Patterned Growth of Well-Aligned Carbon Nanotubes: A Soft-Lithographic Approach," The Journal of Physical Chemistry B., Mar. 16, 2000, vol. 104, No. 10, 2193-2196.

Huang, Houjin, "Purification and alignment of arc-synthesis single-walled carbon nanotube bundles," Chemical Physics Letters,2002, vol. 356, pp. 567-572.

Huang, Y. et al., "Logic Gates and Computation from Assembled Nanowire Building Blocks," Science, vol. 294, Nov. 9, 2001, pp. 1313-1317.

Huang, Yu et al. "Directed Assembly of One-Dimensional Nanostructures into Functional Networks." Science (2001); 291: 630-33.

Hyeon-Lee, Jingyu, "Aero-Sol-Gel Synthesis of Nanostructured Silica Powders," Chemical Materials, 1997, vol. 9, pp. 2400-2403.

Integrated Device Technology, Inc. BG Package Outline, Feb. 18, 1994.

Integrated Device Technology, Inc., DA Package Design, Sep. 25, 1997, 2 pages.

Introduction and Historical Perspective, Chapter 1, pp. 1-48.

Javey, A. et al., "Carbon Nanotube Field-Effect Transistors with Integrated Ohmic Contacts and High-κ Gate Dielectrics," Nano Letters, 2004, vol. 4, No. 3, 447-450.

Javey, A. et al., "High-κ dielectrics for advanced carbon-nanotube transistors and logic gates," nature materials, vol. 1, Dec. 2002, www.nature.com/naturematerials.

Javey, A., et al., "Carbon Nanotube Transistor Arrays for Multistage Complementary Logic and Ring Oscillators," Nano Letters (2002); vol. 2 No. 9 929-932. Published on web Jul. 31, 2002.

Javey, Ali, "Carbon Nanotube Transistor Arrays for Multistage Complementary Logic and Ring Oscillators," Nano Letters, 2002, pp. A-D.

Jorio, A. et al. "Joint density of electronic states for one isolated single-wall carbon nanotube studied by resonant Raman scattering." Physical Review B (2001); 63: 24541(4).

Jorio, A. et al. "Structural (n, m) Determination of Isolated Single-Wall Carbon Nanotubes by Resonant Raman Scattering." Physical Review Letters (Feb. 5, 2001); 86, 1118-1121.

Jorritsma, J., "Fabrication of large arrays of metallic nanowires on V-grooved substrates," Applied Physics Letters, Sep. 4, 1995, vol. 67, pp. 1489-1491.

Joselevich, Ernesto, "Vectorial Growth of Metallic and Semiconducting Single-Wall Carbon Nanotubes," Nano Letters, xxxx, vol. 0, pp. A-E.

Kaneto, K. et al., "Electrical conductivities of multi-wall carbon nanotubes," Synthetic Metals 103 (1999) 2543-2546.

Kiang, Ching-Hwa. "Growth of Large-Diameter Single-Walled Carbon Nanotubes." American Chemical Society (2000); 104, 2454-2456.

Kiang, Ching-Hwa. "Growth of Large-Diameter Single-Walled Carbon Nanotubes." Journal of Physical Chemistry A. (2000); 104, 2454-2456.

Kim, Philip et al. "Nanotube Nanotweezers." Science (1999); 286: 2148-2150.

Kim, W., et al., "Synthesis of Ultralong and High Percentage of Semiconduction Single-walled Carbon Nanotubes," Nano Letters (2002); vol. 2 No. 7 703-708. Published on web Jun. 1, 2002.

Kluth, P., "Fabrication of epitaxial CoSi.sub.2 nanowires," Applied Physics Letters, Aug. 6, 2001, vol. 79, pp. 824-826.

Kong, J. et al. "Synthesis, integration, and electrical properties of individual single-walled carbon nanotubes." Applied Physics A (1999); 69, 305-308.

Kong, J., et al., "Syntheses of Individual Single-Walled Carbon Nanotubes on Patterned Wafers," Nature (1998); 395: 878-881.

Kong, Jing et al. "Quantum Interference and Ballistic Transmission in Nanotube Electron Waveguides." Physical Review Letters (Sep. 3, 2001): 87, 106801(4).

Kong, Jing, "Chemical vapor deposition of methane for single-walled carbon nanotubes," Chemical Physics Letters, 1998, vol. 292, pp. 567-574.

Kong, Jing, "Synthesis of Individual single-walled carbon nanotubes on patterned silicon wafers," Nature, Oct. 29, 1998, vol. 395, pp. 878-881.

Kong, Jing; Chongwu Zhou; Erhan Yenilmez; Hongjie Dai. "Alkaline metal-doped n-type semiconducting nanotubes as quantum dots." AppliеDPhysics Letters (Dec. 11, 2000): 3977-3979.

Legrand, B., "Silicon nanowires with sub 10 nm lateral dimensions: From atomic force microscope lithography based fabrication to electrical measurements," J. Vac. Sci. Technol., May/Jun. 2002, B 20(3), pp. 862-870.

Lei, Y, Fabrication, characterization, and photoluminescence properties of highly ordered $TiO_2$ nanowire arrays, J. Material Research, Apr. 2001, vol. 16, pp. 1138-1144.

Lei, Y., "Fabrication, characterization and Raman study of $TiO_2$ nanowire arrays prepared by anodic oxidative hydrolysis of $TiCl_3$," Chemical Physics Letters, 2001, vol. 338, pp. 231-236.

Lewenstein, Justin C. High-Yield Selective Placement of Carbon Nanotubes on Pre-Patterned Electrodes, Nano Letters., 2002, vol. 2, No. 5, pp. 443-446.

Li, C.P., "Silicon Nanowires Wrapped with Au Film," J. Phys. Chem. B 2002, vol. 106, pp. 6980-6984.

Li, Jian-Long, "Spontaneous formation of ordered indium nanowire array on Si(001)," Applied Physics Letters, Oct. 22, 2001, vol. 79, pp. 2826-2828.

Li, Jun, "Novel Three-Dimensional Electrodes: Electrochemical Properties of Carbon Nanotube Ensembles," J. Phys. Chem. B 2002, pp. A-G.

Li, Mingtao et al. "Direct Three-dimensional Patterning Using Nanoimprint Lithography." Applied Physics Letters (2000); vol. 78, No. 21: 3322-3324.

Li, Q., et al., "High-Density Growth of Single-Wall Carbon Nanotubes on Silicon by Fabrication of Nanosized Catalyst Thin Films," Chem. Mater. (2002), 14, 4262; Published on web Sep. 11, 2002.

Li, Shoutian et al. "Semiconductor Nanoparticles in Contact: Quenching of the Photoluminescence from Silicon Nanocrystals by WO3 nanoparticles Suspended in Solution." The Journal of Physical Chemistry B (1998); 102, 7319-7322.

Li, Y. et al., "Preparation of Monodispersed Fe-Mo Nanoparticles as the Catalyst for CVD Synthesis of Carbon Nanotubes," Chem. Mater., 12. 1008, 2001.

Li, Y., "Fabrication of Highly ordered ZnO nanowire arrays in anodic alumina membranes," J. Materials Research, Nov. 2000, vol. 15, p. 2305-2308.

Li, Y., et al., "Growth of Single-Walled Carbon Nanotubes from Discrete Catalytic Nanoparticles of Various Sizes," The Journal of Physical Chemistry B (2001); 105, 11424.

Li, Yan et al. "Preparation of Monodispersed Fe-Mo Nanoparticles as the Catalyst for CVD Synthesis of Carbon Nanotubes." Chemical Material (2001): 13; 1008-1014.

Li, Yan et al. "Preparation on Monodispersed Fe-Mo Nanoparticles as the Catalyst for CVD Synthesis of Carbon Nanotubes." Chemical Material (2001); 13, 1008-1014.

Li, Yiming et al. "Growth of Single-Walled Carbon Nanotubes from Discrete Catalytic Nanoparticles of Various Sizes." Journal of Physical Chemistry B (2001).

Lin, Y. et al., "Novel Carbon Nanotube FET Design with Tunable Polarity," IEDM 04-687, 2004, 29.2.1-29.2.4.

Liu, C. et al. "Synthesis of Macroscopically Long Ropes of Well-Aligned Single-Walled Carbon Nanotubes." Advanced Materials (Aug. 16, 2000); 12, 1190-1192.

Liu, et al., "Organizing Single-Walled Carbon Nanotubes on Gold Using a Wet Chemical Self-Assembling Technique, Langmuir," Apr. 18, 2000, vol. 16, No. 8, 3659-3573.

Liu, Lei et al. "Controllable Reversibility of an sp2 to sp3 Transition of a single Wall Nanotube under the Manipulation of an AFM Tip." Physical Review Letters (May 22, 2000): 4950-4953.

Liu, Z.Q., "Synthesis of .alpha.-$SiO_2$ nanowires using Au nanoparticle catalysts of a silicon substrate," Journal of Materials Research, Mar. 2001, vol. 16, pp. 683-686.

Louie, Steven G. "Electronic Properties, Junctions, and Defects of Carbon Nanotubes." Topics in Applied Physics (2001); 80, 113-145.

Marsen, Bjorn, "Fullerene-Structured Nanowires of Silicon," Physical Review B, Oct. 15, 1999, vol. 60, No. 16, pp. 11593-11600.

Martel, R. et al., "Carbon Nanotube Field-Effect Transistors and Logic Circuits," DAC 2002, Jun. 10-14, 2002, New Orleans, Lousiana, USA, pp. 1-5.

Martino, Anthony, "Catalyst Testing of Highly Dispersed Metal Nanoparticles for Coal Liquefaction and Coal/Waste Copressing," Catalysis and Chemical Technologies Department, Sandia National Laboratories, pp. 1-7.

Massot, L., "Electrodeposition of carbon films from molten alkaline fluoride media," Electrochimica Acta, Jan. 28, 2002, vol. 47, pp. 1949-1957.

Maurin, I., "Carbon Miscibility in the Boron Layers of the $MgB_2$ Superconductor," Chemical Materials, 2002, pp. A-D.

McEuen, Paul L., Single-Walled Carbon Nanotube Electronics, to be published in the inaugural issue of the IEEE Transactions on Nanotechnology (2002) 9 pgs.

Modern CMOS Technology, Chapter 2, pp. 49-92.

Monthioux, M., "Sensitivity of single-wall carbon nanotubes to chemical processing: an electron microscopy investigation," Carbon, 2001, vol. 39, pp. 1251-1272.

Moore, Gordon E., "Cramming more components into integrated circuits," Electronics, Apr. 19, 1965, vol. 38, No. 8(4), 4 pgs.

Morales, Alfredo et al. "A Laser Ablation Method for the Synthesis of Crystalline Semiconductor Nanowires." Science (1998); 279: 208-11.

Murphy, Robert, "High-Yield, Nondestructive Purification and Quantification Method for Multiwalled Carbon Nanotubes," J. Phys. Chem. B 2002, vol. 106, pp. 3087-3091.

Namatsu, Hideo, "Fabrication of one-dimensional nanowire structures utilizing crystallographic orientation in silicon and their conductance characteristics," J. Vac. Sci. Technol., Sep./Oct. 1997, B 15(5), pp. 1688-1696.

Namatsu, Hideo, "Fabrication of thickness-controlled silicon nanowires and their characteristics," J. Vac. Sci. Technol., Nov./Dec. 1995, B 13(6), pp. 2166-2169.

Nerushev, Oleg A. et al. "Carbon nanotube films obtained by thermal chemical vapor deposition." Journal of Chemistry Materials (2001); 11, 1122-1132.

Nerushev, Oleg A. et al. "Carbon nanotube films obtained by thermal chemical vapour deposition." Journal of Material Chemistry (2001); 11, 1122-1132.

Ng, Hou Tee et al. "Soft-Lithography-Mediated Chemical Vapor Deposition of Architectured Carbon Nanotube Networks on Elastomeric Polymer." American Chemical Society (2001).

O'Connell, Michael J., "Reversible water-solubilization of single-walled carbon nanotubes by polymer wrapping," Chemical Physics Letters, 2001, vol. 342, pp. 265-271.

Odom, Teri Wang et al. "Atomic Structure and Electronic Properties of Single-Walled Carbon Nanotubes." Nature (1998); 391: 62-64.

Odom, Teri Wang et al. "Magnetic Clusters on Single-Walled Carbon Nanotubes: The Kondo Effect in a One-Dimensional Host." Science (2000); 290: 1549-1552.

Odom, Teri Wang et al. "Scanning Probe Microscopy Studies of Carbon Nanotubes." Topics in Applied Physics (2001); 80, 173-211.

Oullette, Jennifer. "Exploiting Molecular Self-Assembly." The Industrial Physicist. American Institute of Physics, Dec. 2000.

Ouyang, Min. "Atomically Resolved Single-Walled Carbon Nanotube Intramolecular Junctions." Science (2001); 291: 97-100.

Peigney, Alain et al. "A Study of the Formation of Single- and Double-Walled Carbon Nanotubes by a CVD Method." Journal of Physical Chemistry B (2001); 105, 9699-9710.

Peng, Shu et al. "Chemical Control of Nanotube Electronics." Nanotechnology (2000); 11: 57-60.

Peng, X.S., "Electrochemical fabrication of ordered $Ag_2S$ nanowire arrays," Materials Research Bulletin, 2002, No. 37, pp. 1369-1375.

Pimenta, M.A., "Diameter dependence of the Raman D-band in isolated single-wall carbon nanotubes," Physical Review B, vol. 64 pp. 04140-1-04140-4.

Postma, Henk W. C. et al. "Manipulation and Imaging of Individual Single-Walled Carbon Nanotubes with an Atomic Force Microscope." Advanced Materials (Sep. 1, 2000); 12, 1299-1302.

Puntes, Victor F., "Synthesis of hcp-Co Nanodisks," J. Amer. Chem. Soc., 2002, vol. 124, pp. 12874-12880.

Radosavljevic, M., Novolatile Memory Elements Based on Ambipolar Nanotube Field Effect Transitors, Nano Letters, 2002, vol. 2, pp. 761-764.

Ramsperger, U., "Fabrication and lateral electronic transport measurements of gold nanowires," Applied Physics Letters, Jan. 1, 2001, vol. 78, pp. 85-87.

Rao, C. N. R. et al. "Nanotubes." CHEMPHYCHEM (2001); 2, 78-105.

Reynoso, J. 391PGA Drawings (3): Project No. 32639103. Kyocera America, Inc. (Apr. 12, 1994).

Robertson, John, "Section 11. Non-Crystalline Carbon, Properties and Prospects for Non-Crystalline Carbons," Journal of Non-Crystalline Solids 299-302, 2002, pp. 798-804.

Robinson, L.A. W., "Self-aligned electrodes for suspended carbon nanotube structures," Microelectronics Research Centre, Cavendish Laboratory, University of Cambridge and Hitachi Cambridge Laboratory, pp. 1-2.

Roucoux, Alain, "Reduced Transition Metal Colloids: A Novel Family of Reusable Catalysts?," Chemical Reviews, Jan. 30, 2002, pp. A-V.

Rueckes, Thomas et al. "Carbon Nanotube-Based Nonvolatile Random Access Memory for Molecular Computing." Science (2000); 289: 94-7.

Saito, R. et al. "Chirality-dependent G-band Raman intensity of carbon nanotubes." Physical Review (2001); 64, 085312(7).

Saito, Riichiro and Hiromichi Kataura. "Optical Properties and Raman Spectroscopy of Carbon Nanotubes." Topics in Applied Physics (2001); 80, 213-247.

Sax, Harald, "Polysilicon Overfill Etch Back Using Wet Chemical Spin-process Technology," 7 pgs.

Schonenberger, Christian et al. "Physics of Multiwall Carbon Nanotubes." Physics World. Apr. 4, 2000.

Sekiba, Daiichiro, "Fabrication of stable nanopatterns on metals," Applied Physics Letters, Sep. 30, 2002, vol. 81, pp. 2632-2634.

Sellmyer, D.J., "Magnetism of Fe, Co and Ni nanowires in self-assembled arrays," J. of Physics: Condensed Matter, (2000) vol. 13, pp. R433-R460.

Serp, Philippe, "Chemical Vapor Deposition Methods for the Controlled Preparation of Supported Catalytic Materials," Chemical Reviews, Apr. 10, 2002, pp. A-AR.

Shim, Moonsub et al. "Polymer Functionalization for Air-Stable n-Type Carbon Nanotube Field-Effect Transistors." Journal of American Chemical Society (2001); 123, 11512-11513.

Shipley, Microposit.RTM. XP-90104A E-Beam Resist, Preliminary Product Information, pp. 1-2.

Sidorov, S. N. et al. "Cobalt Nanoparticle Formation in the Pores of Hyper-Cross-Linked Polystyrene." Chemical Materials (1999); 11, 3210-3215.

Smalley, R. E., Foreword (Publication unknown), Jan. 2001.

Snow, E. et al, "Random Networks of Carbon Nanotubes as an Electronic Material," Applied Physica Letter, Mar. 31, 2003, vol. 82, No. 13, pp. 2145-2147.

Soh, et al., "Integrated Nanotube Circuits: controlled growth and ohmic contacting of single-walled carbon nanotubes," Applied Physics Letters, Aug. 2, 1999, vol. 75, No. 5, 627-629.

Soh, Hyongsok T. et al. "Integrated nanotube circuits." Applied Physics Letters (Aug. 2, 1999); 75, 627-629.

Sohn, Jung Inn, et al., "Patterned selective growth of carbon nanotubes and large field emission from vertically well-aligned carbon nanotube field emitter arrays." Appl. Phys. Letters (Feb. 12, 2001); 78, 901-903.

Stadermann, M. et al., "Nanoscale study of conduction through carbon nanotube networks," Physical Review B 69, 201402(R) (2004), pp. 1-3.

Steuerman, David W., "Interactions between Conjugated Polymers and Single-Walled Carbon Nanotubes," J. Phys. Chem. B 2002, vol. 106, pp. 3124-3130.

Su, M., et al., "A Scalable CVD Method for the Synthesis of Single-Walled Carbon Nanotubes with High Catalyst Productivity." Chemical Physics Letters (2000); vol. 322, 231-326.

Table of Contents for Semiconductor Consulting Services (1999).

Tans, Sander J., "Room-temperature transistor based on a single carbon nanotube," Nature, May 1998, vol. 393, pp. 49-52.

Tat, Kerk Wai, "Preparation and Characterization of Cobalt/Silica Core-Shell Magnetic Nanoparticles," Dept. Chem., National University of Singapore 2000/2001, pp. 1-5.

Tenne, Richard and Alex K. Zettl. "Nanotubes from Inorganic Materials." Topics in Applied Physics (2001); 80, 81-112.

Tombler, Thomas W.; Chongwu Zhou; Jing Kong; Hongjie Dai. "Gating individual nanotubes and crossed with scanning probes." Applied Physics Letters (Apr. 24, 2000): 2412-2414.

Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.

Tulchinsky, D.A., "Fabrication and domain imaging of iron magnetic nanowire arrays," J. Vac. Sci. Technol., May/Jun. 1998, A 16(3), pp. 1817-1819.

Tyagi et al. "A 130nm Generation Logic Technology Featuring 70nm Transistors, Dual Vt Transistors and 6 Layers of Cu Interconnects." Portland Technology Development.

Untiedt, C., Fabrication and Characterization of Metallic Nanowires, Physical Review B, Jul. 15, 1997, vol. 56, No. 4 , pp. 2154-2160.

Wang, Suhua, Thermal Oxidation of $Cu_2S$ Nanowires: a Template Method for the Fabrication of Mesoscopic $Cu_{\chi}O$ ($\chi=1,2$) Wires, Phys. Chem. Chem. Phys., 2002, vol. 4, pp. 3425-3429.

Wang, Y.W., "Fabrication of Ordered Ferromagnetic-Nonmagnetic Alloy Nanowire Arrays and their Magnetic Property Dependence on Annealing Temperature," J. Phys. Chem. B 2002, vol. 106, pp. 2502-2507.

Wei, B. Q. et al. "Organized assembly of carbon nanotubes." Nature (Apr. 4, 2002); 416, 495-496.

Wei, Chengyu et al. "Temperature and Stain-Rate Dependent Plastic Deformation of Carbon Nanotube."

Wei, Y., et al., "Effect of Catalyst Film Thickness on Carbon Nanotube Growth by Selective Area Chemical Vapor Deposition," Applied Physics Letters (2001); vol. 78, pp. 1394-1396.

Whatmore, Roger W. "Nanotechnology." Ingenia. Feb. 2000.

Wind, S. J., "Fabrication and Electrical Characterization of Top Gate Single-Wall Carbon Nanotube Field-Effect Transistors," IBM T. J. Watson Research Center, 14 pgs.

Wind, S. J., "Localized and Directed Lateral Growth of Carbon Nanotubes from a Porous Template," IBM T.J. Watson Research Center, 17 pgs.

Wind, S.J. et al., "Vertical scaling of carbon nanotube field-effect transistors using top gate electrodes," Applied Physics Letters, vol. 80, No. 20, May 20, 2002, pp. 3817-3819.

Wong, Eric et al. "Nanobeam Mechanics: Elasticity, Strength, and Toughness of Nanorods and Nanotubes." Science (1997); 277: 1971-1975.

Woolley, Adam T. et al. "Structural biology with carbon nanotube AFM probes." Chemistry & Biology (2000); 7, R193-204.

Yakobson, Boris I. And Phaedon Avouris. "Mechanical Properties of Carbon Nanotubes." Topics in Applied Physics (2001); 80, 287-327.

Yang. "A High Performance 180 nm Generation Logic Technology." Portland Technology Development.

Yao, B. D. and N. Wang. "Carbon Nanotube Arrays Prepared by MWCVD." Journal of Physical Chemistry (2001); 105, 11395-11398.

Yao, Z., et al, Phys. Rev. Lett, 84, 2941 (2000).

Yao, Zhen et al. "Electrical Transport Through Single-Wall Carbon Nanotubes." Topics in Applied Physics (2001); 80, 147-171.

Yao, Zhen, "High-Field Electrical Transport in a Single-Wall Carbon Nanotubes," Physical Review Letters, Mar. 27, 2000, vol. 84, No. 13, pp. 2641-2944.

Yenilmez, Erhan, "Wafer scale production of carbon nanotube scanning probe tips for atomic force microscopy," Applied Physics Letters, Mar. 25, 2002, vol. 80, pp. 2225-2227.

Yin, A. J., "Fabrication of highly ordered metallic nanowire arrays by electrodeposition," Applied Physics Letters, Aug. 31, 2001, vol. 79, pp. 1039-1041.

Yoshida, Jun-ichi, "Tag Strategy for Separation and Recovery," Chemical Reviews, Mar. 18, 2002, pp. A-X.

Yu , Zhonghua, "(n, m) Structural Assignments and Chirality Dependence in Single-Wall Carbon Nanotube Raman Scattering," J. Phys. Chem. B 2001, vol. 105, pp. 6831-6837.

Yu, et al., J. Phys. Chem. B, 105:6831-6837 (2001).

Yu, Jae-Young, "Silicon Nanowires: Preparation, Device, Fabrication, and Transport Properteis," J. Phys. Chem. B 2000, vol. 104, pp. 11864-11870.

Yun, Wan Soo, "Fabrication of metal nanowire using carbon nanotube as a mask," J. Vac. Sci. Technol., Jul./Aug. 2000, A 18(4), pp. 1329-1332.

Zhang, J., "Fabrication and photoluminescence of ordered GaN nanowire arrays," Journal of Chemical Physics, Oct. 1, 2001, vol. 115, pp. 5714-5717.

Zhang, R. Q., "Silicon nanotubes: Why not?," Chemical Physics Letters, 2002, vol. 364, pp. 251-258.

Zhang, Shengjun et al. "Select Pathways to Caron Nanotube Film Growth." Advanced Materials (Dec. 3, 2001); 13, 1767-1770.

Zhang, Y. and Hongjie Dai. "Formation of metal nanowires on suspended single-walled carbon nanotubes." Applied Physics Letters (Nov. 6, 2000): 3015-3017.

Zhang, Y. et al. "Electric-field-directed growth of aligned single-walled carbon nanotubes." Applied Physics Letters (Nov. 5, 2001): 3155-3157.

Zhang, Y. et al. "Metal coating on suspended carbon nanotubes and its implication to metal-tube interaction." Chemical Physics Letters (Nov. 24, 2000): 35-41.

Zhang, Y., "Formation of metal nanowires on suspended single-walled carbon nanotubes," Applied Physics Letters. Nov. 6, 2000, vol. 77, pp. 3015-3017.

Zhang, Y.F., "Liquid Phase Synthesis of Carbon Nanotubes," Physica B 323, 2002, pp. 293-295.

Zhao, Y.-P. et al. "Frequency-dependent electrical transport in carbon nanotubes." Physical Review B (2001); 64, 201402(4).

Zheng et al, Chemical Vapor Deposition Growth of Well-Aligned Carbon Nanotube Patterns on Cubic Mesoporous Silica Films by Soft Lithography, Chemistry of Materials, Jun. 9, 2001, vol. 13, 2240-2242.

Zheng, Bo, "Efficient CVD Growth of Single-Walled Carbon Nanotubes on Surfaces Using Carbon Monoxide Precursor,"Nano Letters, 2002, pp. A-D.

Zheng, M. J., "Fabrication and optical properties of large-scale uniform zinc oxide nanowire arrays by one-step electrochemical deposition technique," Chemical Physics Letters, 2002, vol. 363, pp. 123-128.

Zhou, Chongwu et al. "Electrical measurements of individual semiconducting single-walled carbon nanotubes of various diameters." Applied Physics Letters (Mar. 20, 2000); 76, 1597-1599.

Zhou, Chongwu: et al. "Electrical measurements of individual semiconducting single-walled carbon nanotubes of various diameters." Applied Physics Letters (Mar. 20, 2000): 1597-1599.

Zhu, H. W. et al. "Direct Synthesis of Long Single-Walled Carbon Nanotube Strands." Science (May 3, 2002); 296, 884-886.

\* cited by examiner

DEVICE SELECTION CIRCUITRY CONSTRUCTED WITH NANOTUBE RIBBON TECHNOLOGY

CROSS-REFERENCE TO RELATED APPLICATIONS

This application is a continuation of and claims priority under 35 U.S.C. §120 to U.S. patent application Ser. No. 11/546,130, filed Oct. 10, 2006 and entitled "Device Selection Circuitry Constructed with Nanotube Technology," which is a continuation of U.S. patent application Ser. No. 10/693,241, now U.S. Pat. No. 7,120,047, filed Oct. 24, 2003 and entitled "Device Selection Circuitry Constructed with Nanotube Technology," which is a continuation of U.S. patent application Ser. No. 09/915,173, now U.S. Pat. No. 6,643,165, filed Jul. 25, 2001 and entitled "Electromechanical Memory Having Cell Selection Circuitry Constructed With Nanotube Technology," the entire contents of which are incorporated herein by reference, which is related to the following patents, filed Jul. 25, 2001, which are incorporated herein by reference in their entireties:

U.S. Pat. No. 6,574,130, entitled "Hybrid Circuit Having Nanotube Electromechanical Memory"; and U.S. Pat. No. 6,919,592, entitled "Electromechanical Memory Array Using Nanotube Ribbons and Method for Making Same."

BACKGROUND

1. Technical Field

This invention relates in general to nonvolatile memory devices for use as memory storage in an electronic device and in particular to nonvolatile memory arrays that use electromechanical elements as the individual memory cells.

2. Discussion of Related Art

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all nonvolatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresisitive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization. See U.S. Pat. Nos. 3,448,302; 4,845,533; 4,876,667; 6,044,008.

Wire crossbar memory (MWCM) has also been proposed. See U.S. Pat. Nos. 6,128,214; 6,159,620; 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 July, 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals to date rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown.

SUMMARY

The invention provides a memory system having electromechanical memory cells. A decoder circuit selects at least one of the memory cells of an array of such cells. Each cell in the array is a crossbar junction at least one element of which is a nanotube or a nanotube ribbon. The decoder circuit is constructed of crossbar junctions at least one element of each junction being a nanotube or a nanotube ribbon.

DETAILED DESCRIPTION

Preferred embodiments of the invention provide new electromechanical memory arrays and methods for making same. In particular, electromechanical memory cells are created that operate anaologously to the NTWCM devices disclosed in WO 01/03208, which is hereby incorporated by reference in its entirety. However, unlike the NTWCM devices disclosed in WO 01/03208, preferred embodiments of the invention replace the suspended nanoscopic wires used in the NTWCM devices with new ribbons made from a matted layer of nanotubes or a non-woven fabric of nanotubes. These new devices are referred to herein as nanotube ribbon crossbar memories (NTRCMs). The new nanotube belt structures are believed to be easier to build at the desired levels of integration and scale (in number of devices made) and the geometries are more easily controlled.

Because the new nanotube belt crossbar memory devices operate analogously to NTWCM, the description of their architecture and principles of operation is brief. Reference may be made to WO 01/03208 for fuller description and background.

Figure 1:
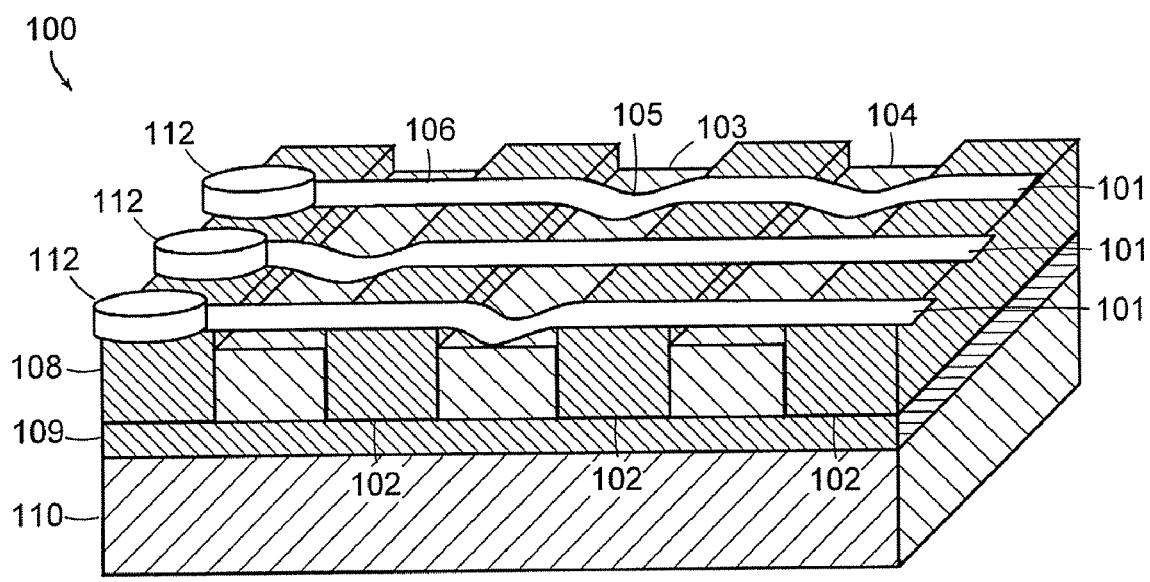
FIG. 1 illustrates a nanotube belt crossbar memory device according to certain embodiments of the invention.

FIG. 1 illustrates an exemplary electromechanical memory array 100 constructed according to principles of preferred embodiments of the invention. The array has a plurality of non volatile memory cells 103 which can be in an "on" state 105 or "off" state 106. The actual number of such cells is immaterial to understanding the invention but the technology may support devices having information storage capacities equivalent to or larger than modern non-volatile circuit devices.

Each memory cell 103 includes a nanotube ribbon 101 suspended by one or more supports 102 over electrical traces or wires, e.g., 104.

Each crossing of a ribbon 101 and a wire, e.g., 104 forms a crossbar junction and defines a memory cell. Under certain embodiments, each cell may be read or written by applying currents and or voltages to electrodes 112 which are in electrical communication with ribbons 101 or through electrodes (not shown) in communication with traces or wires 104. The supports 102 are made from a layer 108 of silicon nitride ($Si_3N_4$). Below layer 108 is a gate oxide layer 109 separating the n-doped silicon traces 104 from an underlying silicon wafer 110.

Figure 2A:
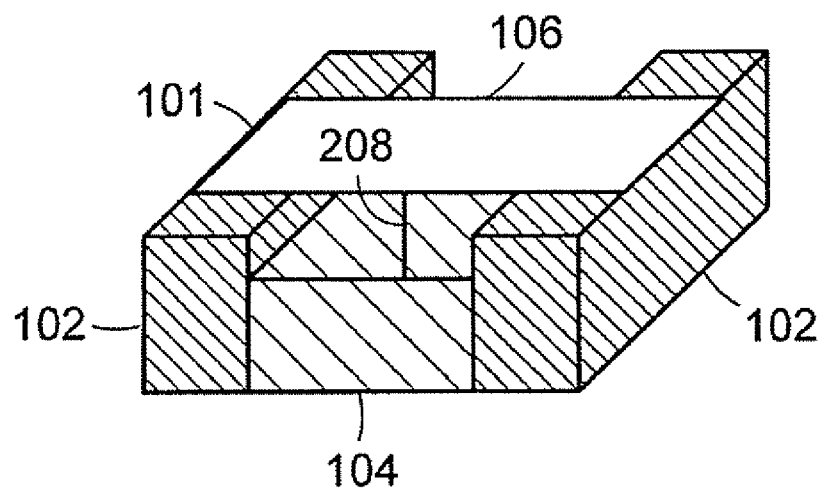
FIGS. 2A-B illustrate two states of a memory cell according to certain embodiments of the invention.
Figure 2B:
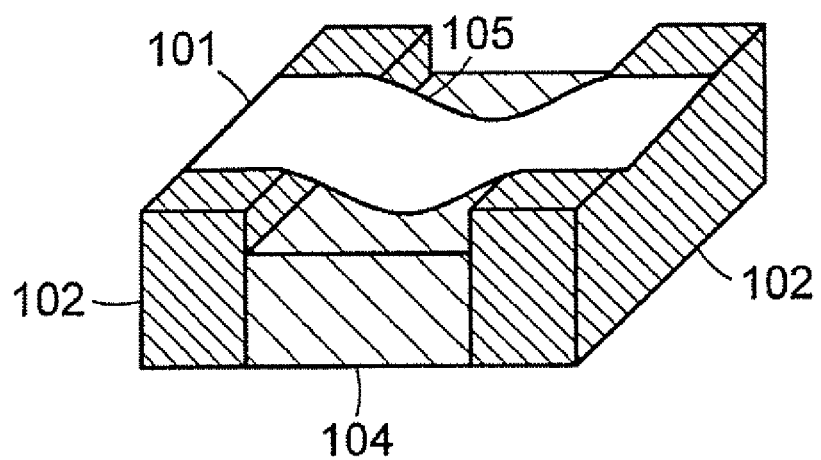

Referring conjointly to FIGS. 1-2B, junction 106 illustrates the cell in a first physical and electrical state in which the nanotube ribbon 101 is separated from corresponding trace 104. Junction 105 illustrates the cell in a second physical and electrical state in which the nanotube ribbon 101 is deflected toward corresponding trace 104. In the first state, the junction is an open circuit, which may be sensed as such on either the ribbon 101 or trace 104 when so addressed. In the second state, the junction is a rectified junction (e.g., Schottky or PN), which may be sensed as such on either the tube 101 or trace 104 when so addressed.

Under certain embodiments, the nanotube ribbon 101 may be held in position at the supports by friction. In other embodiments the ribbon may be held by other means, such as by anchoring the ribbons to the supports using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength. The nanotube ribbons or individual nanotubes can also be pinned through the use wafer bonding to the surface. See R. J. Chen et al., "Noncovalent Sidewall Functionalization of Single-Walled Carbon Nanotubes for Protein Immobiliation," J. Am. Chem. Soc., 123, 2001, 3838-39 and Dai et al., Appl. Phys. Lett., 77, 2000, 3015-17 for exemplary techniques for pinning and coating nanotubes by metals. See also WO 01/03208 for techniques.

Under certain preferred embodiments as shown in FIGS. 2A-B, a nanotube ribbon 101 has a width of about 180 nm and is pinned to a support 102 preferably fabricated of silicon nitride. The local area of trace 104 under ribbon 101 forms an n-doped silicon electrode and is positioned close to the supports 102 and preferably is no wider than the belt, e.g., 180 nm. The relative separation 208 from the top of the support 102 to the deflected position where the belt 101 attaches to electrode 206 (see FIG. 2B) should be approximately 5-50 nm. The magnitude of the separation 208 is designed to be compatible with electromechanical switching capabilities of the memory device. For this embodiment, the 5-50 nm separation is preferred for certain embodiments utilizing ribbons 101 made from carbon nanotubes, but other separations may be preferable for other materials. This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube ribbon 101 of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. (In contrast, growing individual nanotubes over a distance beyond sub millimeter distances is currently unfeasible.) The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.) Moreover, the resistances of the ribbons should be significantly lower than that for an individual nanotubes, thus, decreasing its impedance, since the ribbons may be made to have larger cross-sectional areas than individual nanotubes.

Figures 3, 3A:
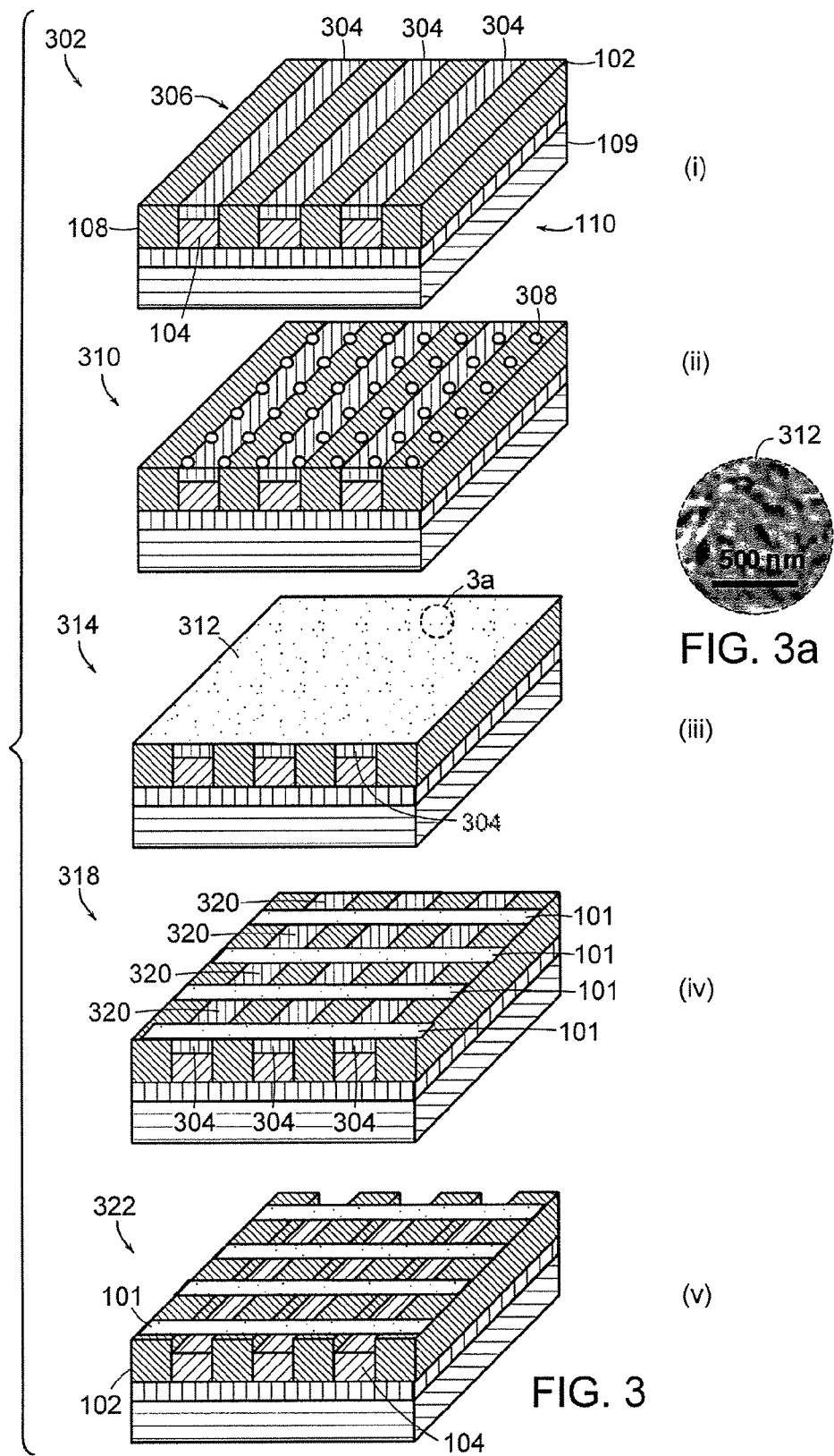
FIGS. 3 and 3A illustrate acts of making memory devices according to certain embodiments of the invention.

FIG. 3 illustrates a method of making certain embodiments of NTRCM devices 100. A first intermediate structure 302 is created or provided. In the illustrated embodiment, the structure 302 includes a silicon substrate 110 having an insulating layer 109 (such as silicon dioxide) and a silicon nitride layer ($Si_3N_4$) 108 that defines a plurality of supports 102. In this instance, the supports 102 are formed by rows of patterned silicon nitride, though many other arrangements are possible, such as a plurality of columns. Conductive traces 104 extend between supports 102. In this instance, the traces 104 are shown as essentially contacting the supports 102, but other arrangements are possible as are other geometries; for example, spaces may exist between trace 104 and support 102 and trace 104 may be fashioned as a wire or may have non-rectangular transverse, cross-sections, including triangular or trapezoidal. Sacrificial layers 304 are disposed above the traces 104 so as to define one planar surface 306 with the upper surface of the supports 102. This planar surface, as will be explained below, facilitates growth of a matted nanotube layer of certain embodiments.

Once such a structure 302 is created or provided, the upper surface 306 receives a catalyst 308. For example, under certain embodiments, a catalyst metal 308, containing iron (Fe), molybdenum (Mo), cobalt or other metals, is applied by spin-coating or other application techniques to create a second intermediate structure 310.

A matted layer 312 of nanotubes is then grown into a non-woven fabric of single-walled carbon nanotubes (SWNTs) to form a third intermediate structure 314. For example, the second intermediate structure 310 may be placed into an oven and heated to a high temperature (for example, about 800-1200° C.) while gases containing a carbon source, hydrogen and inert gas, such as argon or nitrogen, are flowed over the upper surface. This environment facilitates the generation or growth of the matted layer or film 312 of single-walled carbon nanotubes. The layer 312 is primarily one nanotube thick and the various tubes adhere to one another via Van der Waals forces. Occasionally, one nanotube grows over the top of another, though this growth is relatively infrequent due to the growth tendencies of the material.

Under some embodiments (not shown), the catalyst 308 may be patterned to assist in growing the nanotubes with specific densities either more or less dense as is desired. When conditions of catalyst composition and density, growth environment, and time are properly controlled, nanotubes can be made to evenly distribute over a given field that is primarily a monolayer of nanotubes. Proper growth requires control of parameters including but not limited to catalyst composition and concentration, functionialization of the underlying surface, spin coating parameters (length and RPM), growth time, temperature and gas concentrations.

A photoresist may then be applied to the layer 312 and patterned to define ribbons in the matted layer of nanotubes 312. The ribbon patterns cross (for example, perpendicularly) the underlying traces 104. The photoresist is removed to leave ribbons 101 of non-woven nanotube fabric lying on planar surface 306 to form fourth intermediate structure 318.

The fourth intermediate structure 318 has portions 320 of its underlying sacrificial layer 304 exposed as shown. The structure 318 is then treated with an acid, such as HF, to remove the sacrificial layer 304, including the portion under the ribbons 101, thus forming an array 322 of ribbons 101 suspended over traces 104 and supported by supports 102.

Subsequent metalization may be used to form addressing electrodes, e.g., 112 shown in FIG. 1.

One aspect of the above technique is that the various growth, patterning, and etching operations may use conventional techniques, such as lithographic patterning. Currently, this may entail feature sizes (e.g., width of ribbon 101) of about 180 nm to as low as 130 nm, but the physical characteristics of the components are amenable to even smaller feature sizes if manufacturing capabilities permit.

Figure 4:
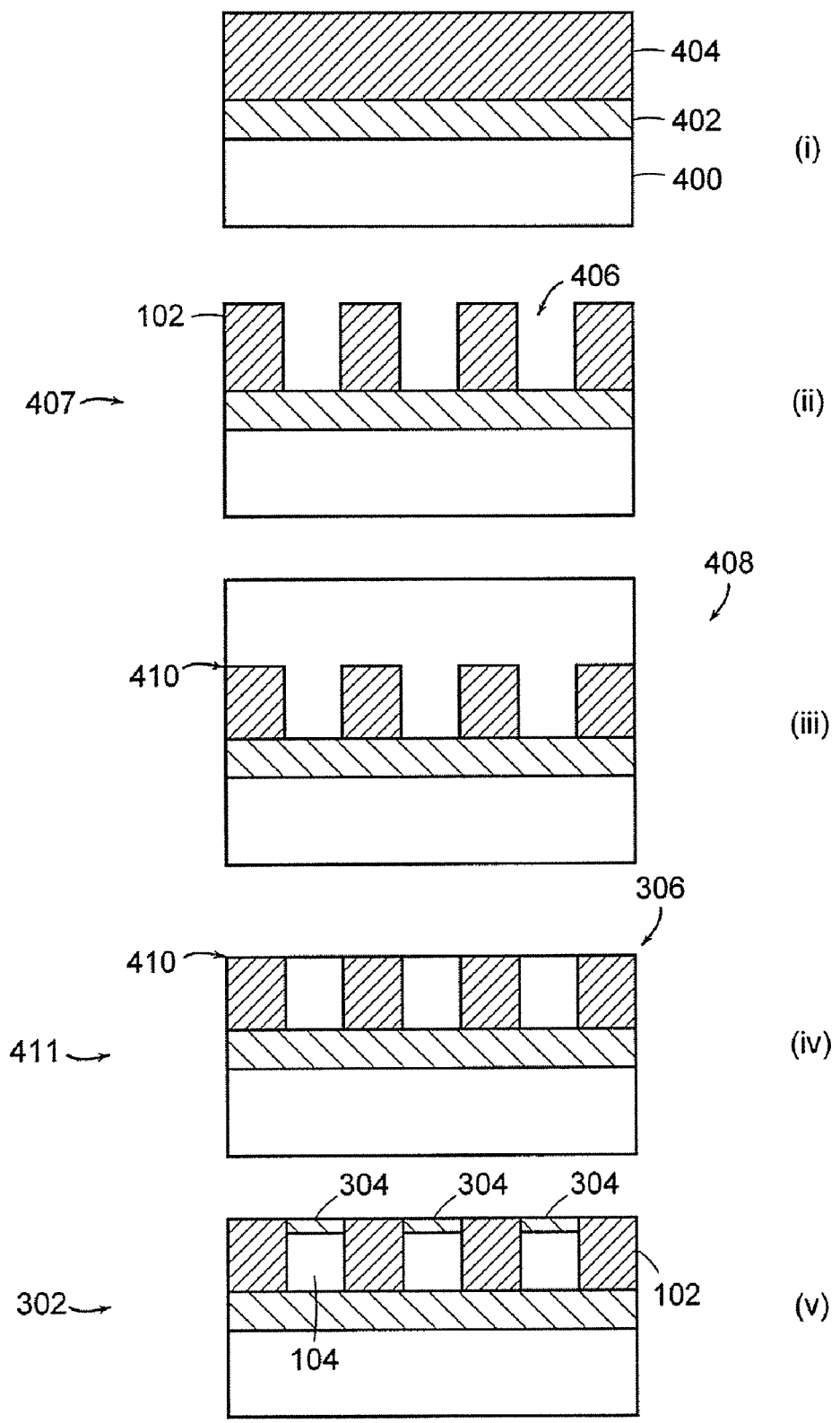
FIGS. 4-11 illustrate several forms of creating an intermediate structure used to make memory devices according to certain embodiments of the invention.

As will be explained below, there are many possible ways of creating the intermediate structures or analogous structures described above. FIG. 4, for example, shows one way to create the first intermediate structure 302.

A silicon wafer 400 is provided with an oxide layer 402. The oxide layer is preferably a few nanometers in thickness but could be as much 1 μm. A silicon nitride ($Si_3N_4$) layer 404 is deposited on top of the oxide surface 402. The silicon nitride layer is preferably at least 30 nm thick.

The silicon nitride layer 404 is then patterned and etched to generate cavities 406 to form support structure 407. With modern techniques the cavity width may be about 180 nm wide or perhaps smaller. The remaining silicon nitride material defines the supports 102 (e.g., as row, or perhaps columns).

A covering 408 of n-doped silicon is then deposited to fill the cavities 406. The covering 408 for exemplary embodiments may be about 1 μm thick but may be as thin as 30 nm.

The covering 408 is then processed, for example by self-flattening of thick silicon layers or by annealing, to produce a planar surface 306, discussed above, to form structure 411. In the case of self-flattening, reactive ion-etching (RIE) with end-point detection (EPD) may be utilized until the upper surface 410 of the etched silicon nitride is reached.

The structure 411 is then oxidized to form and define sacrificial layers 304 of $SiO_2$ about 10-20 nm deep into planar surface 306.

The unconverted, remaining portions of silicon form traces 104.

Figure 5:
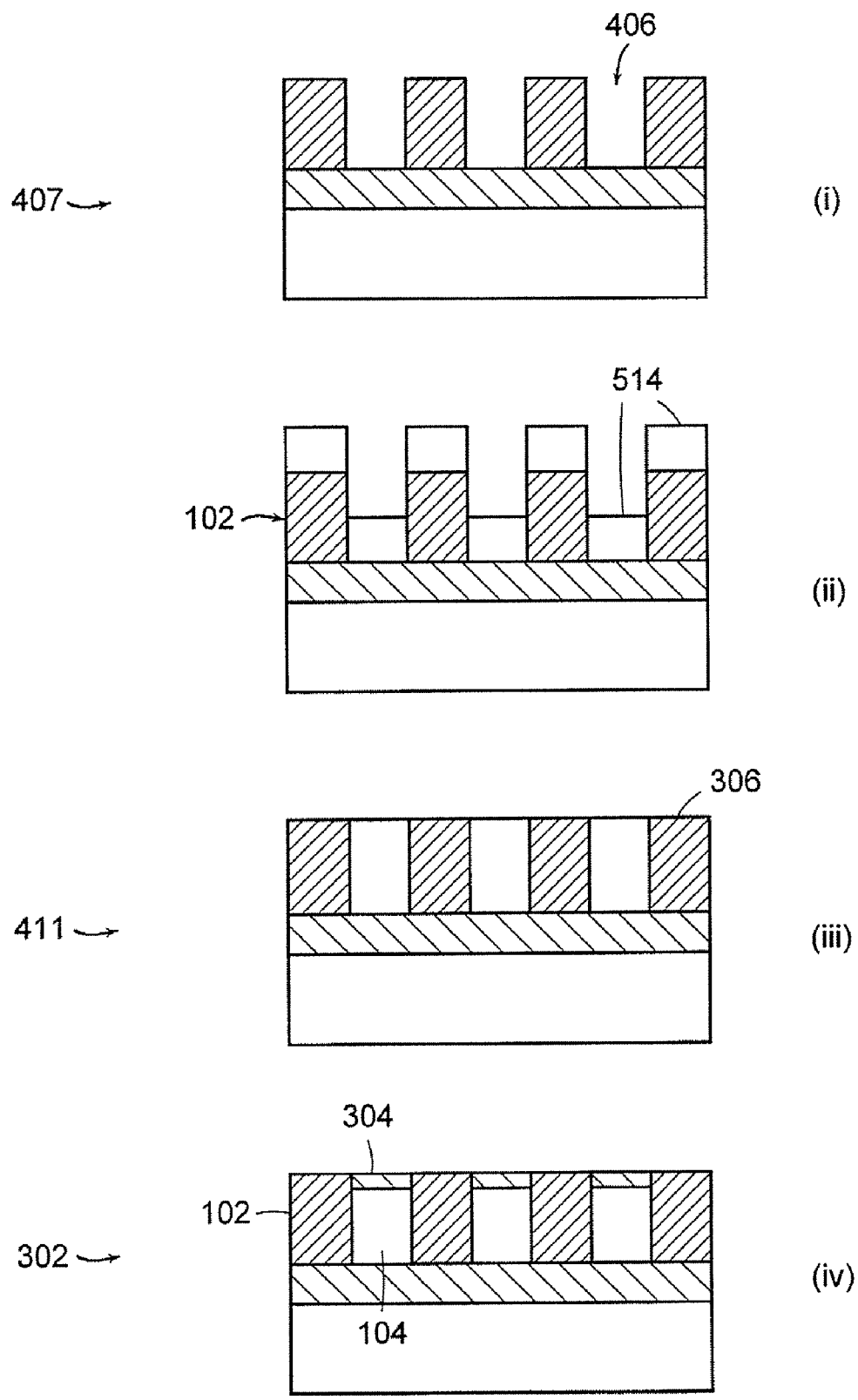

FIG. 5 shows another method that may be used to create the NTRCM devices 100 of certain embodiments. A support structure 407, like that described in connection with FIG. 4, is provided. A layer 514 of n-doped silicon is then added using a CVD process, sputtering or electroplating. Under certain embodiments, layer 514 is added to be about half the height of the $Si_3N_4$ supports 102.

After the layer 514 is added, an annealing step is performed to yield a planarized surface 306 to form a structure 411 like that described above. The annealing step causes the silicon of layer 514 to flow into the cavities 406.

Like that described in connection with FIG. 4, the structure 411 is then oxidized to form and define sacrificial layers 304 of $SiO_2$ about 10-20 nm deep into planar surface 306.

Figure 6:
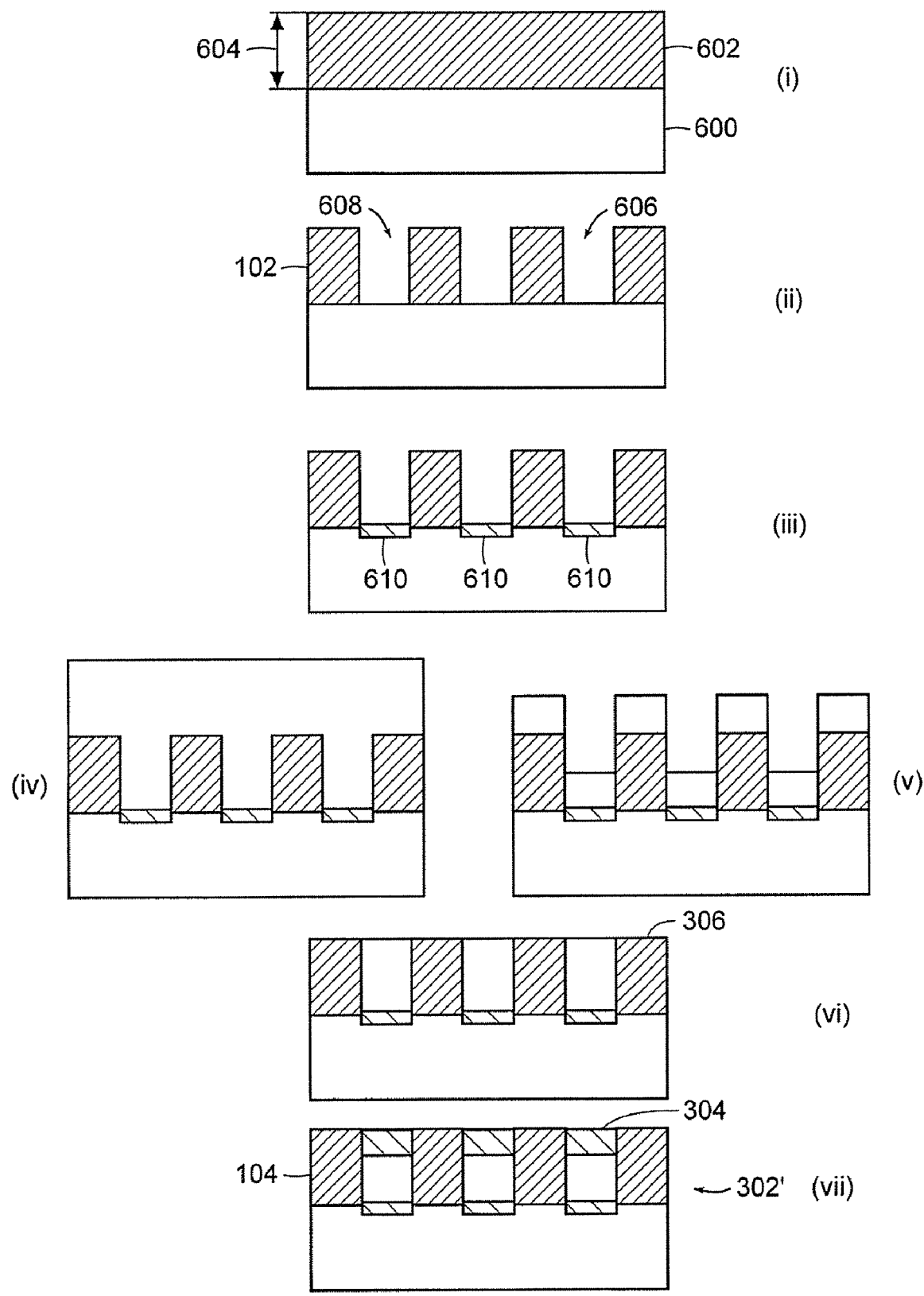

FIG. 6 shows another approach for forming an alternative first intermediate structure 302'. In this embodiment, a silicon substrate 600 is covered with a layer 602 of silicon nitride having a height 604 of at least 30 nm.

The silicon nitride layer 602 is then patterned and etched to generate spacings 606 and to defined supports 102. The etching process exposes a portion 608 of the surface of silicon substrate 600.

The exposed silicon surface 608 is oxidized to generate a silicon dioxide ($SiO_2$) layers 610 having a thickness of a few nm. These layers 610 eventually insulate traces 104 analogously to the way insulating layer 109 did for the above described structures 302.

Once the insulating layers 610 have been created, the traces 104 may be created in any of a variety of manner. FIG. 6 illustrates the processing steps of FIGS. 4-5 used to create such traces to illustrate this point.

Figure 7:
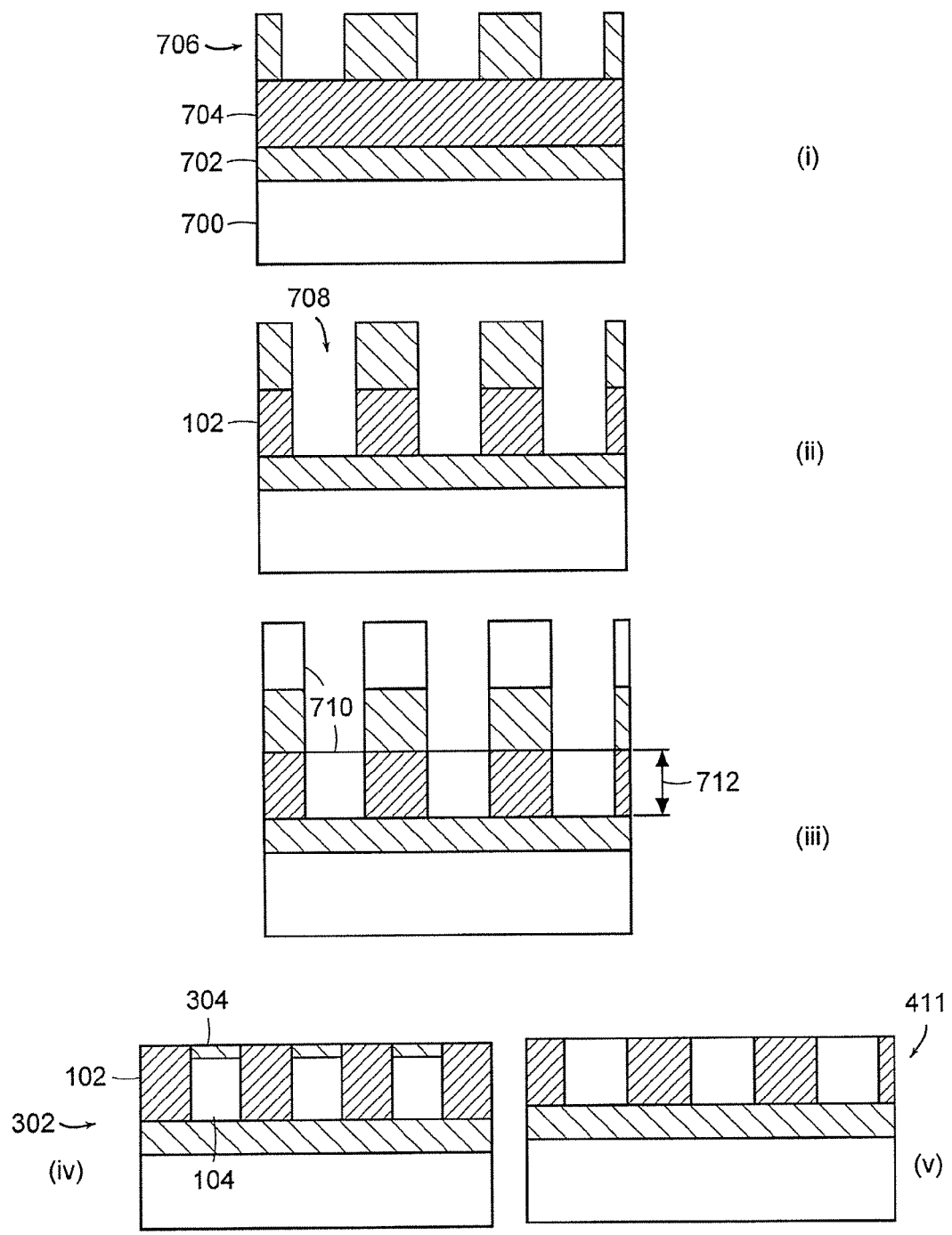

FIG. 7 shows another approach for forming first intermediate structure 302. A silicon substrate 700 having a silicon dioxide layer 702 and a silicon nitride layer 704 receives a patterned photoresist layer 706. For example, a photoresist layer may be spin-coated on layer 704 and subsequently exposed and lithographically developed.

Reactive ion etching (RIE) or the like may then be used to etch the $Si_3N_4$ layer 704 to form cavities 708 and to define supports 102.

Afterwards, n-doped silicon 710 may be deposited in the cavities 708. Under certain embodiments silicon is deposited to a height about equal to the height 712 of the $Si_3N_4$ supports 102.

The photoresist 706 and silicon 710 on top of the photoresist 706 are then stripped away to form an intermediate structure 411 like that described above.

The structure 411 is then oxidized to generate the sacrificial $SiO_2$ layers 304.

Figure 8:
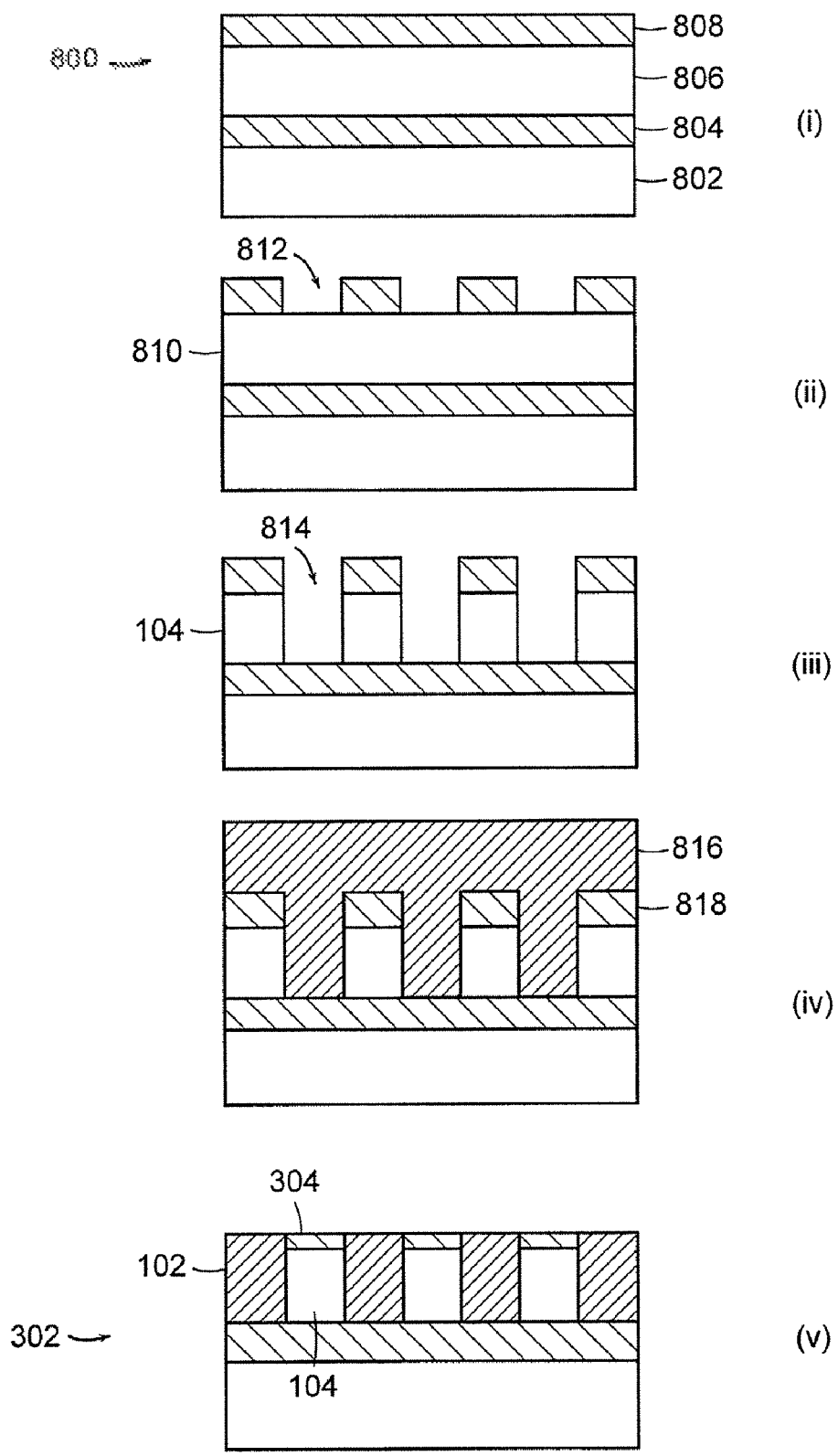

FIG. 8 shows another approach for forming first intermediate structure 302. Under this approach, a starting structure 800 is provided having a lowest silicon layer 802 with a lowest silicon dioxide layer 804 on top of it. A second silicon layer 806 is on top of layer 804 and a second silicon dioxide layer 808 is on top of the second silicon layer 806.

The top silicon dioxide ($SiO_2$) layer 808 is patterned by photolithography to create an RIE mask 810; The mask is used to etch the exposed portions 812 of second silicon layer 806 down to the first silicon dioxide layer 804. This etching creates cavities 814 and defines traces 104.

The cavities 814 are filled and covered with silicon nitride ($Si_3N_4$) 816.

The $Si_3N_4$ covering 816 is backetched with RIE to the same height 818 as the remaining portions of the $SiO_2$ layer 806 covering the n-doped silicon electrodes 104 (which form the sacrificial layer 304).

Figure 9:
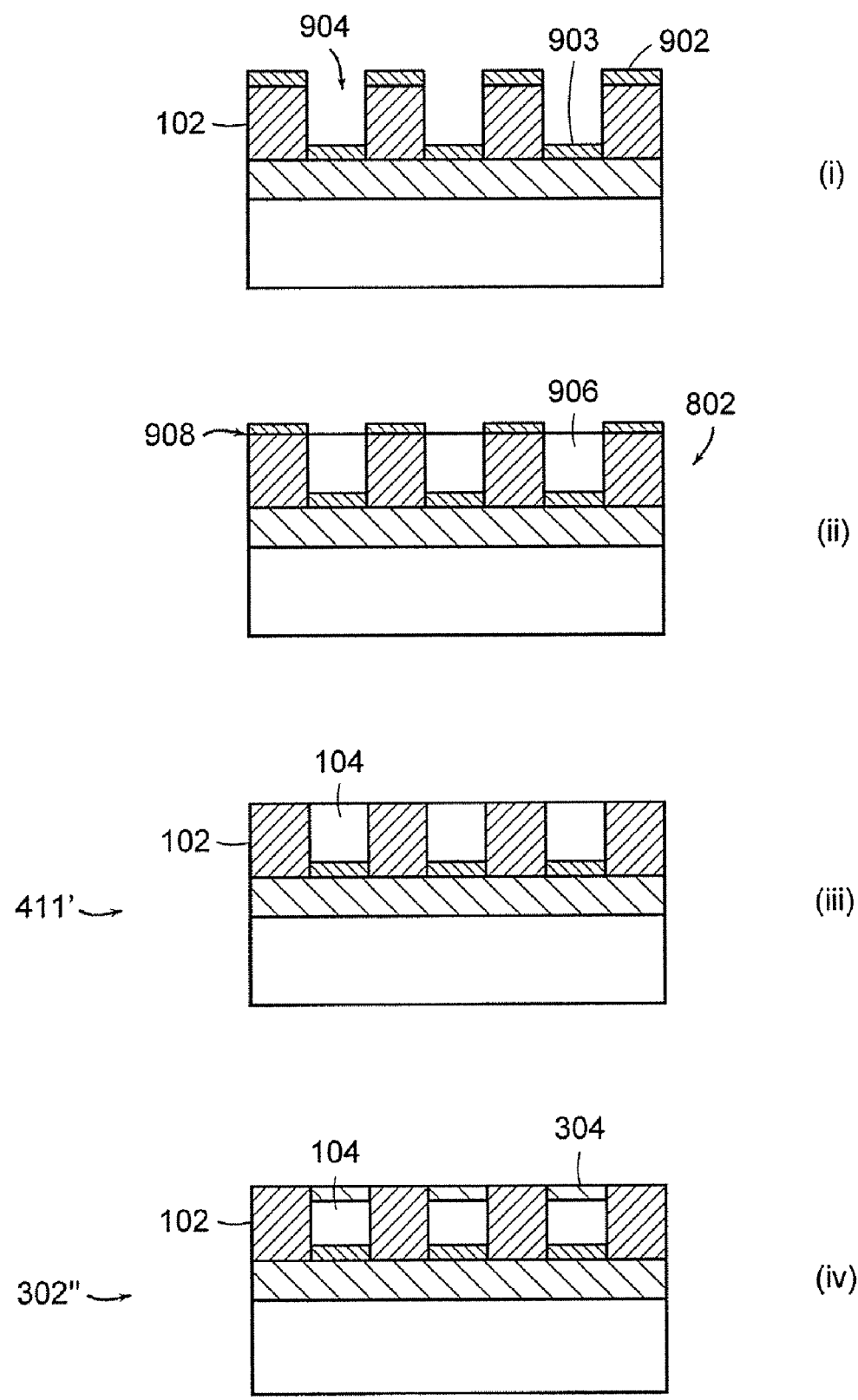

FIG. 9 shows an approach for forming an alternative first intermediate structure 302". Under this approach, a structure like 407 (shown in FIG. 4, but not FIG. 9) is provided. In this instance, the $Si_3N_4$ supports 102 have a height of about 30 nm. A thin layer of metal 902 is deposited on top of the $Si_3N_4$ supports 102 and on top of the exposed portions $SiO_2$ at the bottom of the cavities 904 as depicted by item 903. Metal 902 and 903 form temporary electrodes. A layer of n-doped silicon 906 may then be deposited or grown by electroplating, covering the electrode 903 until the silicon 906 achieves a height 908 at the top of the support 102 and contacting electrode 902. The growth process may be controlled by the onset of a current flow between the lower and upper metal electrodes 902,3.

The exposed metal electrodes 902 may then be removed by wet chemical methods or dry chemical methods. This forms an intermediate structure 411' like the structure 411 described above, but with a buried electrode 903, as an artifact of the silicon growing process.

The structure 411' is then oxidized to form sacrificial layers 304 at the exposed portions of silicon, as described above. For example, the layers 304 may be grown to a thickness of about 10 nm.

Figure 10:
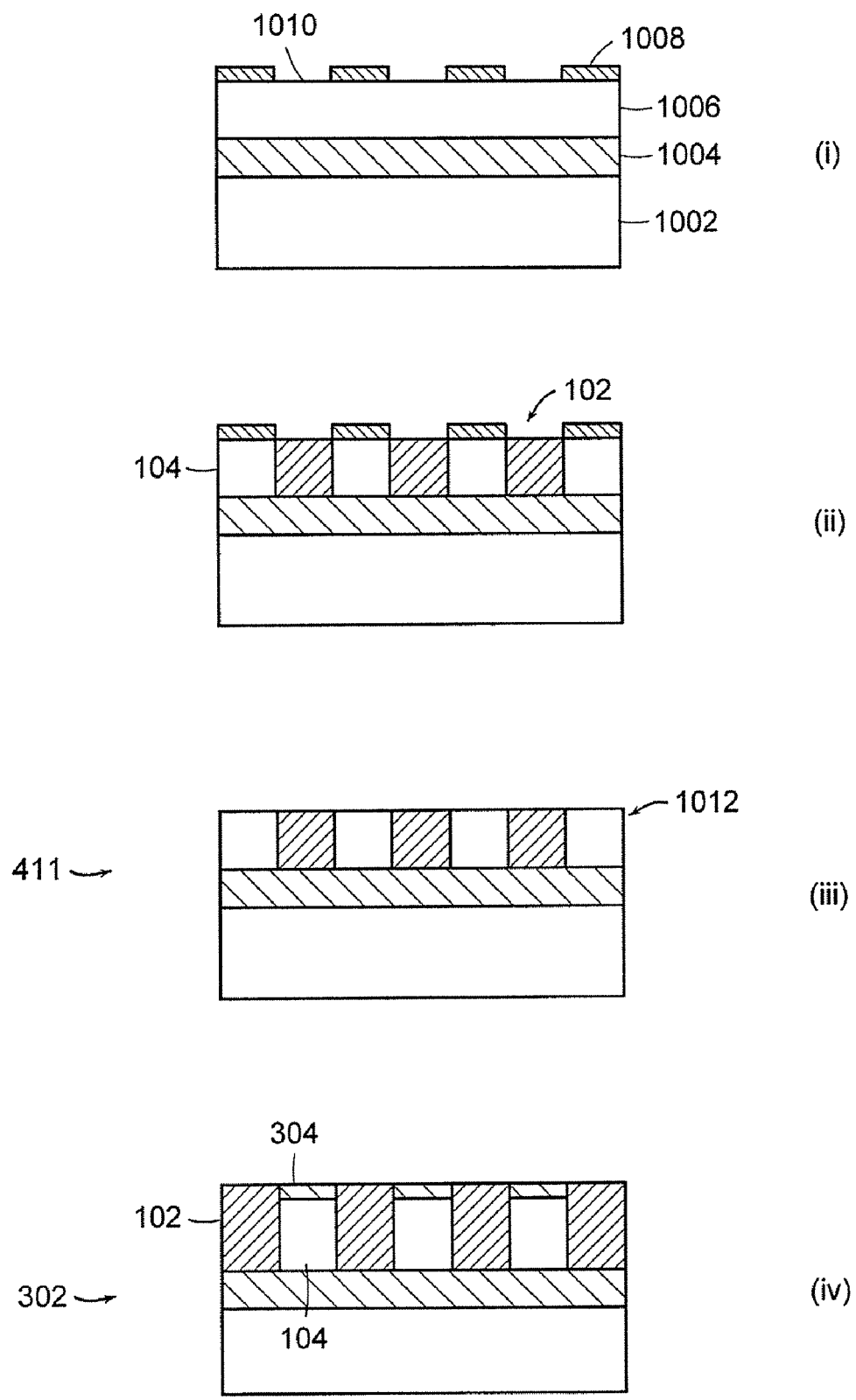

FIG. 10 shows another approach for forming first intermediate structure 302. A silicon substrate 1002 having a layer of silicon dioxide 1004 on top of it and a second layer 1006 of silicon (n-doped) on top of layer 1004 is used as a starting material. A mask layer 1008 is photolithographically patterned on top of layer 1006.

Using nitridization techniques, exposed portions 1010 of n-doped silicon layer 1006 are chemically converted to $Si_3N_4$ supports 102. The unconverted portions of layer 1006 form traces 104.

The mask 1008 is removed forming a structure 411 like that described above.

The exposed portions 1012 of silicon surface are then oxidized to form the $SiO_2$ sacrificial layers 304.

Figure 11:
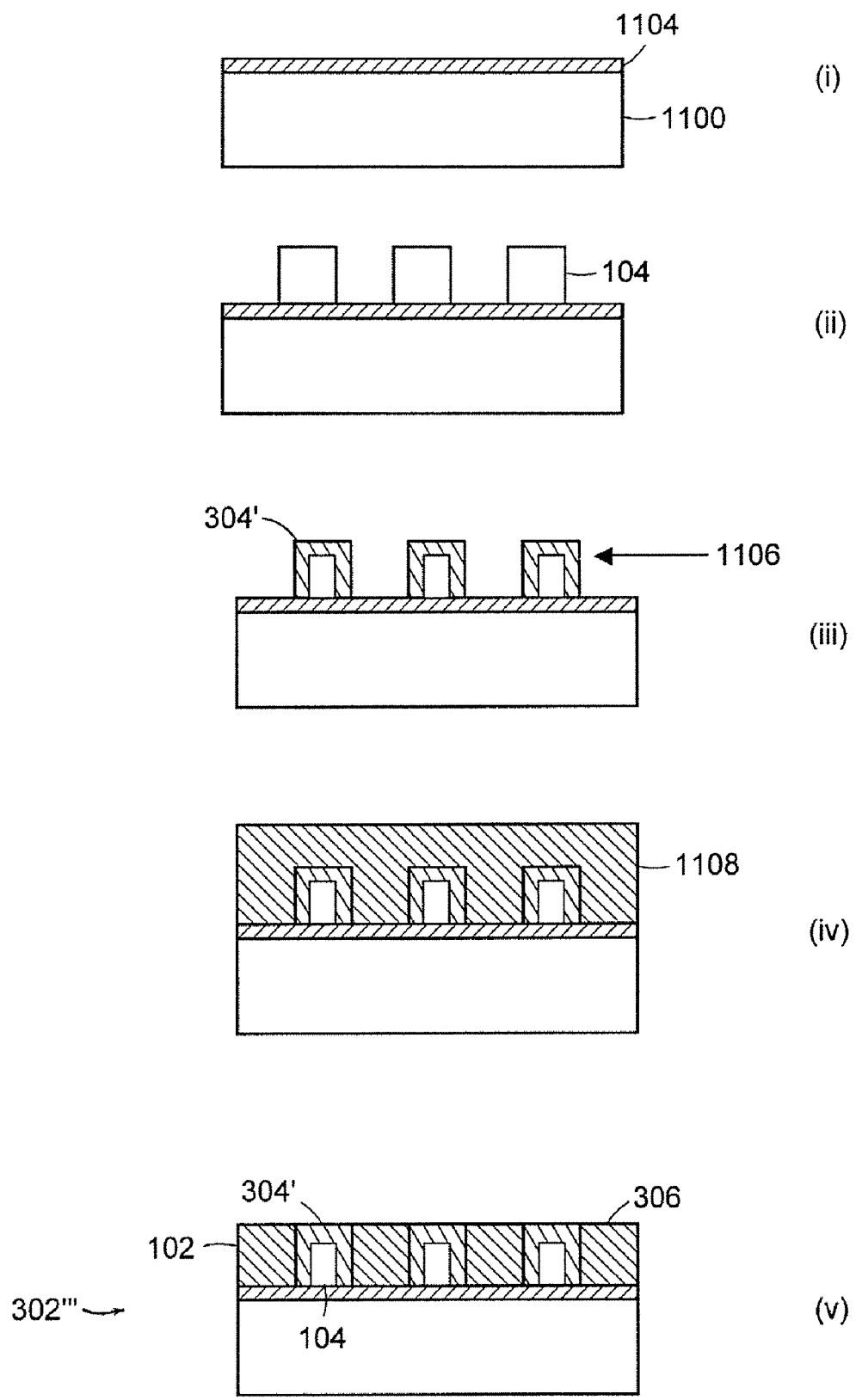

FIG. 11 shows an approach for forming an alternative first intermediate structure 302'" Under this approach a silicon substrate 1100 is layered with a thin film 1104 of $Si_3N_4$ as a starting structure. On top of the silicon nitride layer 1104, n-doped silicon is added and lithographically patterned, by RIE, to form traces 104.

The surfaces of traces 104 are oxidized to form the $SiO_2$ layer 1106 which acts as an alternative form of sacrificial layer 304'.

The structure is overgrown with $Si_3N_4$ 1108 and back etched to form a planar surface 306 and to form alternative first intermediate structure 302'". As will be evident to those skilled in the art, under this approach, when the sacrificial layer is subsequently removed, traces 104 will be separated from supports 102. Other variations of this technique may be employed to create alternative transverse cross-sections of trace 104. For example, the traces 104 may be created to have a rounded top, or to have a triangular or trapezoidal cross section. In addition, the cross section may have other forms, such as a triangle with tapered sides.

As was explained above, once a first intermediate structure is formed, e.g., 302, a matted nanotube layer 312 is provided over the planar surface 306 of the structure 302. In preferred embodiments, the non-woven fabric layer 312 is grown over the structure through the use of a catalyst 308 and through the control of a growth environment. Other embodiments may provide the matted nanotube layer 312 separately and apply it directly over the structure 302. Though structure 302 under this approach preferably includes the sacrificial layer to provide a planar surface to receive the independently grown fabric, the sacrificial layer may not be necessary under such an approach.

Figure 12:
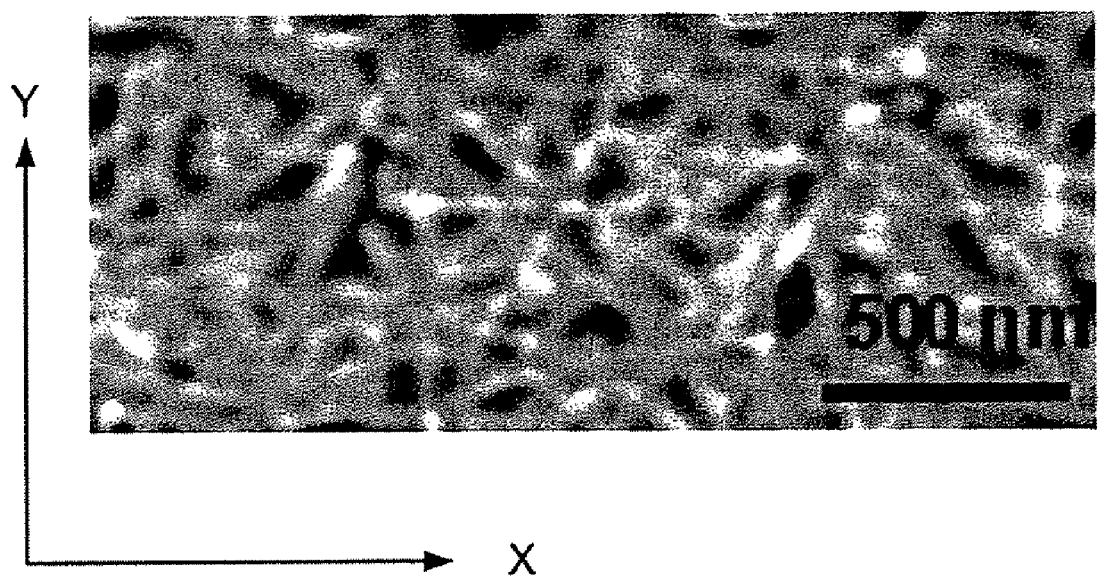
FIG. 12 illustrates the non-woven nanotube fabric, or matted nanotube layer, used to make certain embodiments of the invention.

Because the growth process causes the underside of such nanotubes to be in contact with planar surface 306 of intermediate structure 302, they exhibit a "self-assembly" trait as is suggested by FIG. 12. In particular, individual nanotubes tend to adhere to the surface on which they are grown whenever energetically favorable, such that they form substantially as a "monolayer." Some nanotubes may grow over another so the monolayer is not expected to be perfect. The individual nanotubes do not "weave" with one another but do adhere with one another as a consequence of Van der Waals forces. FIG. 12 is an approximate depiction of an actual nanotube non-woven fabric. Because of the small feature sizes of nanotube, even modern scanning electron microscopy cannot "photograph" an actual fabric without loss of precision; nanotubes have feature sizes as small as 1-2 nm which is below the precision of SEM. FIG. 12 for example, suggests the fabric's matted nature; not clear from the figure, however, is that the fabric may have small areas of discontinuity with no tubes present. Each tube typically has a diameter 1-2 nm (thus defining a fabric layer about 1-2 nm) but may have lengths of a few microns but may be as long as 200 microns. The tubes may curve and occasionally cross one another. Tubes attach to one another via Van der Waals forces.

In certain embodiments, nanotubes grow substantially unrestrained in the x- and y-axis directions, but are substantially restricted in the z-axis (perpendicular to page of FIG. 12) as a consequence of the self-assembly trait. Other embodiments may supplement the above approach to growing matte 312 with the use of field-oriented or flow-oriented growth techniques. Such supplementation may be used to further tailor growth such that any growth in one planar axis (e.g. the—x-axis) is retarded. This allows for a more even coverage of the desired area with a planar interwoven monolayer coating of nanotubes with a controllable density.

Figure 13:
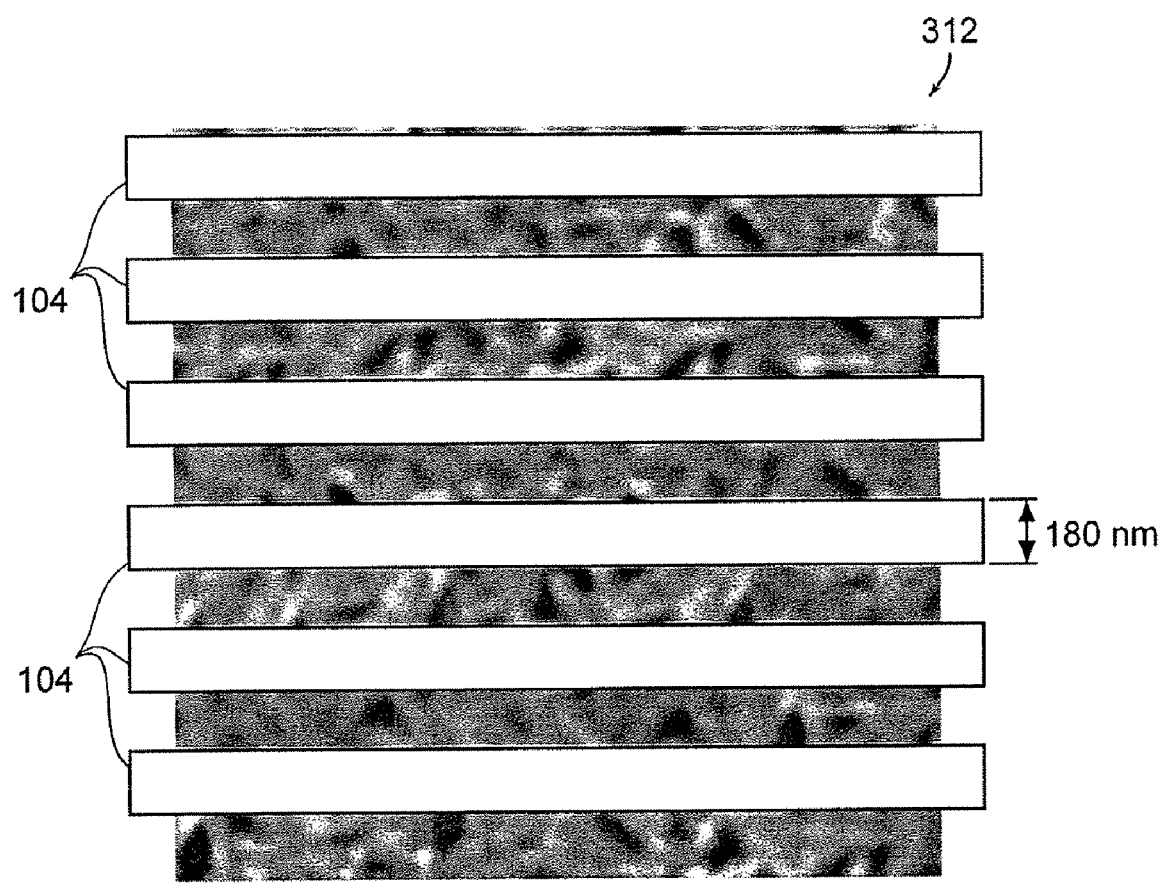
FIG. 13 illustrates the matted nanotube layer in relation to hidden, underlying traces of certain embodiments of the invention.

A plan view of the matted nanotube layer 312 with underlying silicon traces 104 is shown in FIG. 13.

As explained above, once the matted nanotube layer 312 is provided over the surface 306, the layer 312 is patterned and etched to define ribbons 101 of nanotube fabric that cross the supports 102. The sacrificial layer is then removed (e.g., with acid) forming the array 322 described above in connection with FIG. 3. Because the matted layer of nanotubes 312 form a non-woven fabric that is not a contiguous film, etchants or other chemicals may diffuse between the individual nanotube "fibers" and more easily reach the underlying components, such as the sacrificial layer.

Subsequent metalization may be used to form addressing electrodes, e.g., 112 shown in FIG. 1, as outlined above. Other embodiments use nanotube technology to implement addressing of memory cells instead of using metallized electrodes 112 and addressing lines (not shown).

More specifically, under certain embodiments described above, nanotubes are used to form NTRCM arrays. Certain embodiments use nanotube technology, whether in individual wire or belt form, to implement addressing logic to select the memory cell(s) for reading or writing operations. This approach furthers the integration of nanotube technology into system design and may provide beneficial functionality to higher-level system design. For example, under this approach the memory architecture will not only store memory contents in non-volatile manner but will inherently store the last memory address.

The nanotube-based memory cells have bistability characterized by a high ratio of resistance between "0" and "1" states. Switching between these states is accomplished by the application of specific voltages across the nanotube belt or wire and the underlying trace, in which at least one of the memory cell elements is a nanotube or a nanotube ribbon. In one approach, a "readout current" is applied and the voltage across this junction is determined with a "sense amplifier." Reads are non-destructive, meaning that the cell retains its state, and no write-back operations are needed as is done with DRAM.

Figure 14:
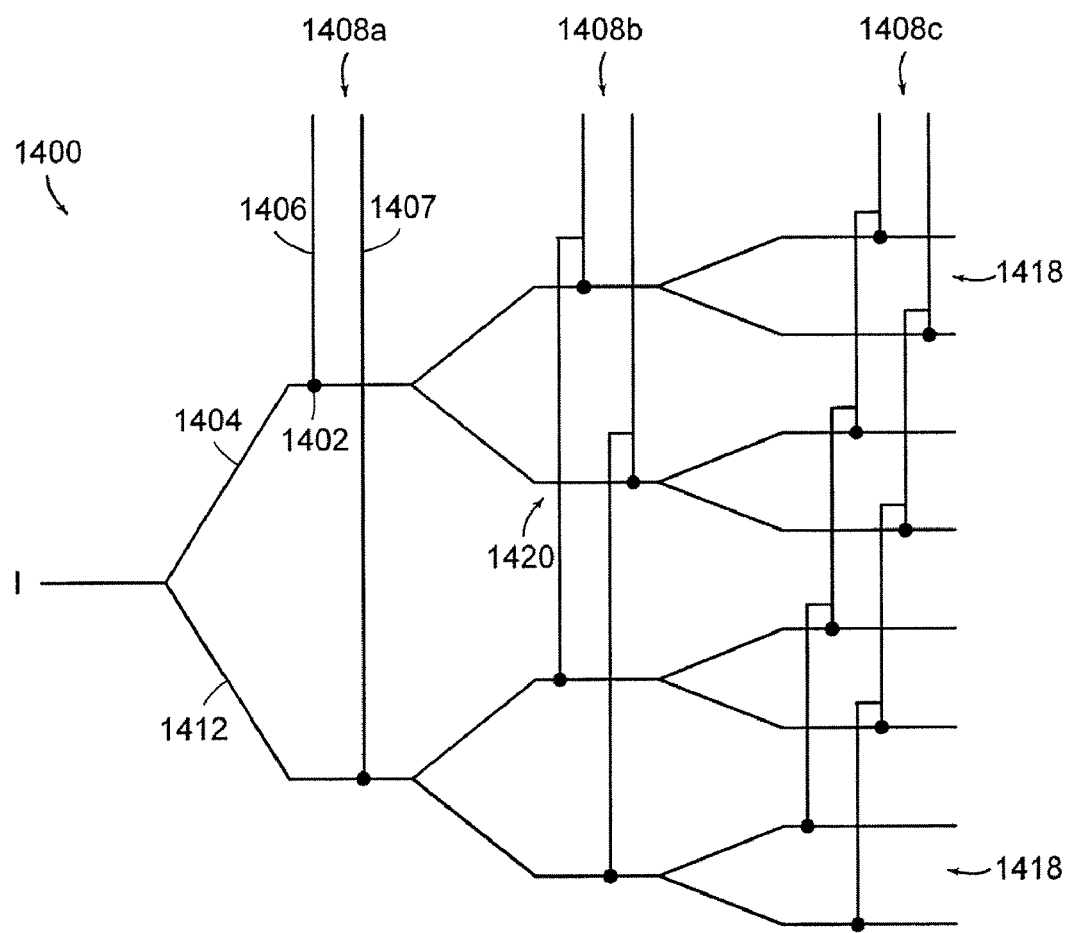
FIG. 14 illustrates addressing logic of certain embodiments of the invention.

FIG. 14 depicts a branching binary select system, or decoder, 1400. As will be explained below, decoder 1400 may be implemented with nanotubes or nanotube ribbon technology. Moreover, the decoder may be constructed on the same circuit component as a nanotube memory cell array, e.g., NTRCM or NTWCM.

A perpendicular intersection of two lines 1404 and 1406 depicted as a dot 1402 indicates a junction of two nanotubes or nanotube ribbons. In this regard, the interaction is analogous to a "pass transistor" found in CMOS and other technology, in which the intersection may be opened or closed.

Locations such as 1420 where one nanotube or nanotube ribbon may cross another but which are not intended to create a crossbar junction may be insulated from one another with a lithographically patterned insulator between the components.

For the sake of clarity, the decoder illustrated is for a 3-bit binary address carried on addressing lines 1408. Depending on the value of the encoding the intersections (dots) will be switched to create only one path through which sensing current I may pass to select lines 1418.

To use this technique, a "dual rail" representation 1408 of each bit of the binary address is fashioned externally so that each of the address bits 1410 is presented in true and complementary form. Thus, line 1406 may be the logical true version of address line 1408a and line 1407 may be the logical complement of address line 1408a. The voltage values of the representation 1408 are consistent with that needed to switch a crossbar junction to the "1" or "0" state as described above.

In this fashion an address 1408 may be used to supply a sense current I to a bit or row of bits in an array, e.g., to nanotubes or nanotube ribbons. Likewise, the same approach may be used to sense a given trace, for example, selecting specific array column(s) to read sense from in conjunction with selecting a row. Thus this approach may be used for X and/or Y decoding both for reading and for writing operations.

Figure 15:
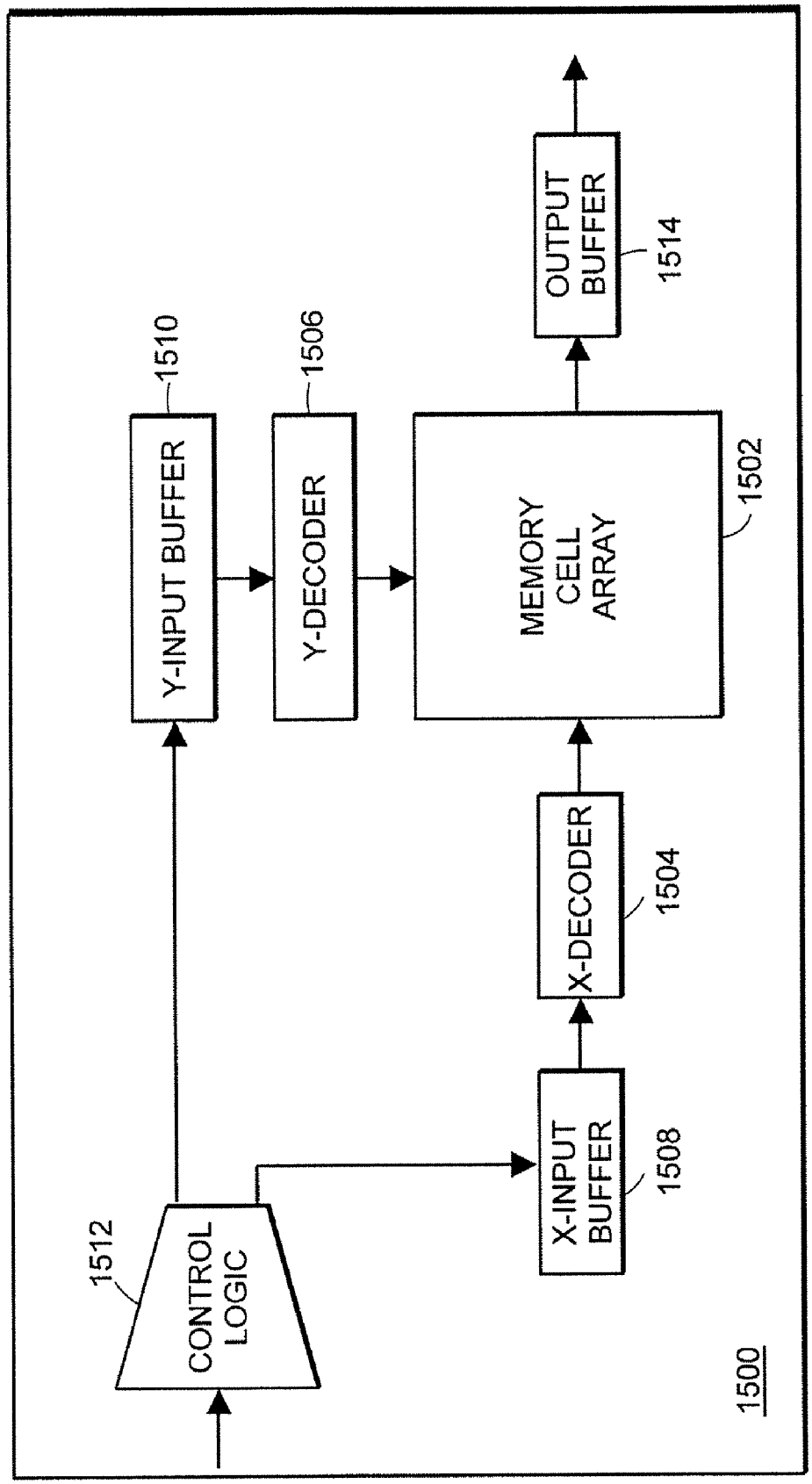
FIG. 15 illustrates a hybrid technology embodiment of the invention in which the memory core uses nanotube technology.

Certain embodiments of the invention provide a hybrid technology circuit 1500, shown in FIG. 15. A core memory cell array 1502 is constructed using NTWCM or NTRCM, and that core is surrounded by semiconductor circuits forming X and Y address decoders 1504 and 1506; X and Y buffers 1508 and 1510; control logic 1512 and output buffers 1514. The circuitry surrounding the NTWCM or NWBCM core may be used for conventional interfacing functions, including providing read currents and sensing output voltages.

In other embodiments, the X and Y address decoders 1504 and 1506 may be substituted with the nanotube wire or belt addressing technique discussed above. In these embodiments the core would include memory cells and addressing logic.

In certain embodiments, the hybrid circuit 1500 may be formed by using a nanotube core (having either just memory cells or memory cells and addressing logic) and by implementing the surrounding circuitry using a field programmable gate array. The core and gate array circuitry may be contained in a single physical package if desired. Or, they may be packaged separately. For example, a hermetically packaged nanotube circuit (having memory or memory and addressing logic) may be combined with a PLD/FPGA/ASIC in which the I/O interfacing logic is contained. The resulting compact chipset provides access to the benefits of the NT memory for the user of the product, while maximizing the use of "off-the-shelf" technologies, which may be utilized on an as-needed basis by the manufacturer.

Figure 16:
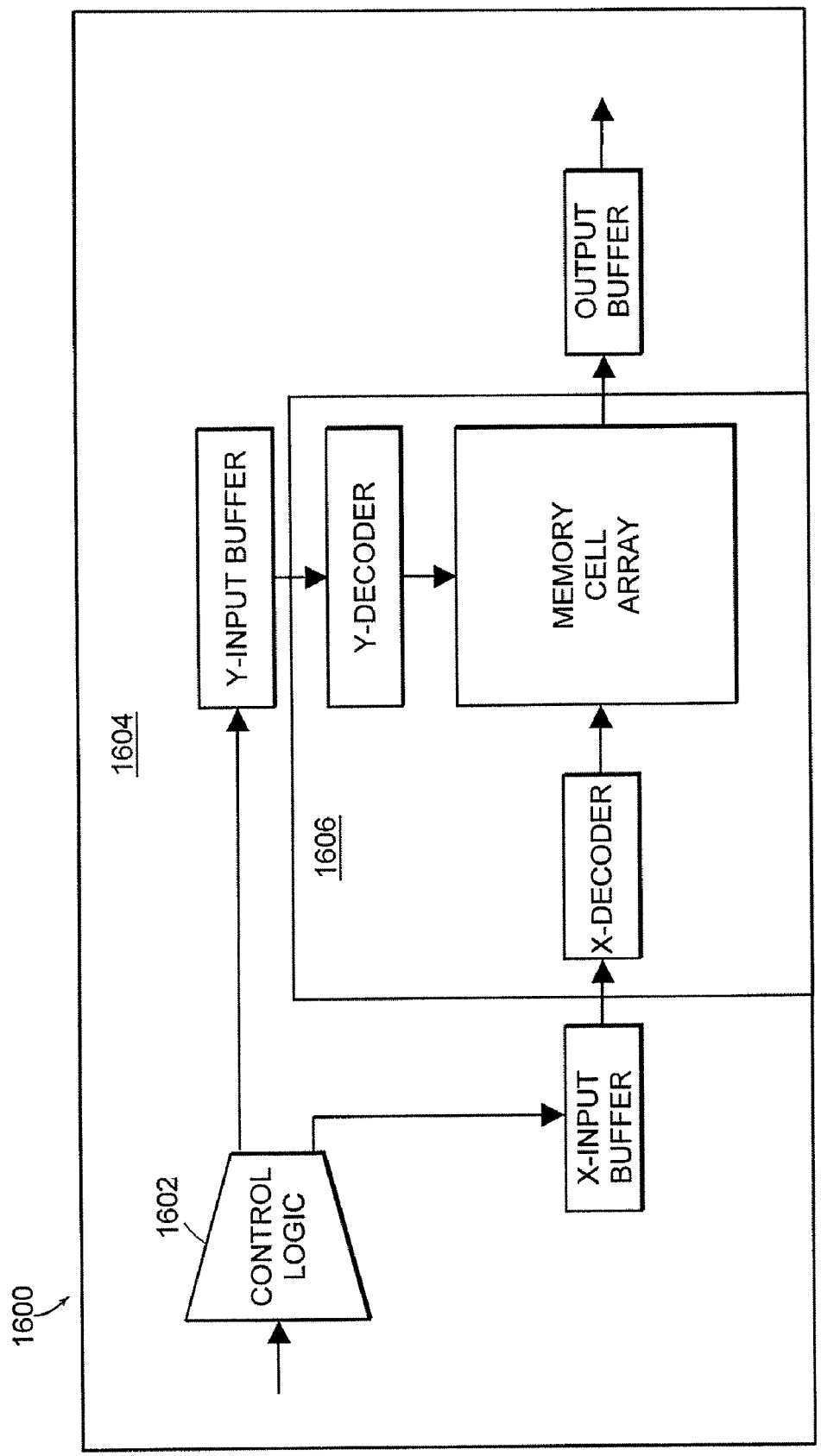
FIG. 16 illustrates a hybrid technology embodiment of the invention in which the memory core and addressing lines use nanotube ribbon technology.

FIG. 16 depicts one possible implementation 1600 of the hybrid technology. A FPGA chip 1602 containing the buffering and control logic (described above) is connected via conducting traces on a (perhaps multilayer) printed circuit board (PCB) 1604 to a nanotube (NT) chip 1606 containing the memory cells and addressing logic.

This particular embodiment is suggested to conform to the PCI bus standard, typical of today's personal computers. Other passive circuitry, such as capacitors, resistors, transformers, etc. (not pictured) would also be necessary to conform to the PCI standard. A front-side bus speed of 200 MHz-400 MHz is annotated, suggesting the kinds of external clock speeds such a chipset might run at. This speed is limited by the PCB interconnects and FPGA/PLD/ASIC speed, and also the chip packages, not the NT memory cell speed.

OTHER EMBODIMENTS

Besides carbon nanotubes other materials with electronic and mechanical properties suitable for electromechanical switching could be envisioned. These materials would have properties similar to carbon nanotubes but with different and likely reduced tensile strength. The tensile strain and adhesion energies of the material must fall within a range to allow bistability of the junction and electromechanical switching properties to exist within acceptable tolerances.

For the purpose of integrating CMOS logic for addressing two approaches can be envisioned. In the first embodiment the nanotube array will be integrated before metallization but after ion implantation and planarization of the CMOS logic devices. A second method involves growth of the nanotube arrays before fabrication of the CMOS devices involving ion implementation and high temperature annealing steps. Upon completion of these steps the final metallization of both the nanotube ribbons and the CMOS devices will proceed using standard and widely used protocols.

Electrodes consisting of n-doped silicon on top of some metal or semiconductor line can also be envisioned. This will still provide rectifying junctions in the ON state so that no multiple current pathways exist.

In addition to rectifying junctions, there are other widely accepted and used methods to prevent the occurrence of electrical crosstalk (i.e. multiple current pathways) in crossbar arrays. Tunnel barriers on top of the static, lithographically fabricated electrodes prevent the formation of ohmic ON states. No leakage currents at zero bias voltage will occur but a small bias voltage has to be applied for the charge carriers to overcome this barrier and tunnel between the crossing lines.

Methods to increase the adhesion energies through the use of ionic, covalent or other forces can be envisioned to alter the interactions with the electrode surfaces. These methods can be used to extend the range of bistability with these junctions.

Nanotubes can be functionalized with planar conjugated hydrocarbons such as pyrenes which may then aid in enhancing the internal adhesion between nanotubes within the ribbons.

Certain of the above aspects, such as the hybrid circuits and the nanotube technology for addressing, are applicable to individual nanotubes (e.g., using directed growth techniques, etc.) or to nanotube ribbons.

It will be further appreciated that the scope of the present invention is not limited to the above-described embodiments but rather is defined by the appended claims, and that these claims will encompass modifications of and improvements to what has been described.

What is claimed is:

1. A nanotube switch, comprising:
a nanotube ribbon comprising a plurality of nanotubes and having upper and lower major surfaces wherein the upper and lower major surfaces are substantially parallel;
a first conductive element in contact with at least a portion of the lower major surface of the nanotube ribbon; and
a second conductive element in contact with at least a portion of the upper major surface of the nanotube ribbon,
the nanotube ribbon switching between first and second states in response to electrical stimulus at the first and second conductive elements.

2. The nanotube switch of claim 1, wherein the nanotube ribbon provides a plurality of electrical pathways between the first and second conductive elements in the first state, and wherein the nanotube ribbon provides substantially no electrical pathways between the first and second conductive elements in the second state.

3. The nanotube switch of claim 1, wherein the nanotube ribbon provides a number of electrical pathways between the first and second conductive elements that is based on the electrical stimulus.

4. The nanotube switch of claim 1, wherein the nanotube ribbon is permanently pinned to at least one of the first and second conductive elements.

5. The nanotube switch of claim 1, wherein the nanotube ribbon is in non-volatile contact with both of the first and second conductive elements.

6. The nanotube switch of claim 1, wherein van der Waals forces pin the nanotube ribbon to at least one of the first and second conductive elements.

7. The nanotube switch of claim 1, wherein the nanotube ribbon is in spaced relation to the second conductive element in the second state.

8. The nanotube switch of claim 1, wherein the nanotube ribbon switches between the first and second states in response to electrical stimulus at only the first and second conductive elements.

9. The nanotube switch of claim 1, wherein the electrical stimulus comprises a current and a voltage.

10. The nanotube switch of claim 1, wherein the nanotube ribbon has a width, and wherein at least one of the first and second conductive elements has a width no greater than the width of the nanotube ribbon.

11. The nanotube switch of claim 1, wherein at least one of the first and second conductive elements has a substantially rectangular cross section.

12. The nanotube switch of claim 1, wherein at least one of the first and second conductive elements comprises metal.

13. The nanotube switch of claim 1, wherein at least one of the first and second conductive elements comprises doped silicon.

14. The nanotube switch of claim 1, wherein at least one of the first and second conductive elements has multiple surfaces in contact with an insulator.

15. The nanotube switch of claim 1, wherein at least one of the nanotube ribbon and the first and second conductive elements has at least one lateral dimension smaller than about 180 nm.

16. The nanotube switch of claim 1, wherein the nanotube ribbon comprises a multilayer nanotube fabric.

17. The nanotube switch of claim 1, wherein the nanotube ribbon comprises a monolayer nanotube fabric.

18. The nanotube switch of claim 1, wherein a portion of at least one of the upper and lower surfaces of the nanotube ribbon contacts an insulator.

19. The nanotube switch of claim 1, wherein the first and second conductive elements are in electrical communication with buffering and control logic.

20. The nanotube switch of claim 19, wherein the buffering and control logic are integrated with the nanotube switch on a single chipset.

21. The nanotube switch of claim 1, further comprising hermetic packaging.

* * * * *